(12) United States Patent
Bae et al.

(10) Patent No.: US 8,050,084 B2
(45) Date of Patent: Nov. 1, 2011

(54) NONVOLATILE MEMORY DEVICE, STORAGE SYSTEM HAVING THE SAME, AND METHOD OF DRIVING THE NONVOLATILE MEMORY DEVICE

(75) Inventors: Jun-Soo Bae, Hwaseong-si (KR); Kwang-Jin Lee, Hwaseong-si (KR); Beak-Hyung Cho, Hwaseong-si (KR)

(73) Assignee: Samsung Electronics Co., Ltd., Suwon-Si, Gyeonggi-Do (KR)

( * ) Notice: Subject to any disclaimer, the term of this patent is extended or adjusted under 35 U.S.C. 154(b) by 0 days.

(21) Appl. No.: 12/893,413

(22) Filed: Sep. 29, 2010

(65) Prior Publication Data

US 2011/0080775 A1 Apr. 7, 2011

Related U.S. Application Data

(63) Continuation-in-part of application No. 12/453,420, filed on May 11, 2009, now Pat. No. 7,817,465, which is a continuation of application No. 11/896,721, filed on Sep. 5, 2007, now Pat. No. 7,548,451.

(30) Foreign Application Priority Data

Sep. 5, 2006 (KR) .................... 10-2006-0085253
Oct. 23, 2009 (KR) .................... 10-2009-0101262

(51) Int. Cl.
*G11C 11/00* (2006.01)
(52) U.S. Cl. .................. 365/163; 365/211; 365/222
(58) Field of Classification Search .............. 365/163, 365/148, 211, 122, 222, 212
See application file for complete search history.

(56) References Cited

U.S. PATENT DOCUMENTS

| 6,809,978 B2 | 10/2004 | Alexander et al. |
| 6,868,025 B2 | 3/2005 | Hsu |
| 6,870,783 B2 | 3/2005 | Kwak et al. |
| 6,885,602 B2 | 4/2005 | Cho et al. |
| 6,982,913 B2 | 1/2006 | Oh et al. |
| 7,113,424 B2 | 9/2006 | Happ et al. |
| 7,149,103 B2 | 12/2006 | Ahn |
| 7,248,526 B2 | 7/2007 | Ito et al. |
| 7,286,432 B2 | 10/2007 | Heilmann et al. |
| 7,315,469 B2 | 1/2008 | Choi et al. |
| 7,548,451 B2 | 6/2009 | Oh et al. |
| 7,817,465 B2 * | 10/2010 | Oh et al. .............. 365/163 |
| 2006/0028886 A1 | 2/2006 | Choi et al. |

(Continued)

FOREIGN PATENT DOCUMENTS

| JP | 2004-273110 A | 9/2004 |
| KR | 10 2005-0020356 A | 3/2005 |

(Continued)

*Primary Examiner* — Anh Phung
*Assistant Examiner* — Hien Nguyen
(74) *Attorney, Agent, or Firm* — Lee & Morse, P.C.

(57) ABSTRACT

A nonvolatile memory device includes a memory cell array including a plurality of nonvolatile memory cells each having a resistance corresponding to one of a plurality of first resistance distributions, a temperature compensation circuit including one or more reference cells each having a resistance corresponding to one among one or more second resistance distributions, and a data read circuit including a compensation unit and a sense amplifier, the compensation unit being adapted to supply compensation current to a sensing node, an amount of the compensation current varying based on the resistance of each reference cell, and the sense amplifier being adapted to compare the level of the sensing node with a reference level and to output a comparison result.

19 Claims, 31 Drawing Sheets

U.S. PATENT DOCUMENTS

2008/0123389 A1* 5/2008 Cho et al. .................. 365/148
2008/0158941 A1* 7/2008 Choi et al. ................. 365/163
2008/0159017 A1 7/2008 Kim et al.
2008/0291715 A1 11/2008 Park et al.

FOREIGN PATENT DOCUMENTS

| | | |
|---|---|---|
| KR | 10 2005-0029013 A | 3/2005 |
| KR | 10 2005-0107199 A | 11/2005 |
| KR | 10 2006-0022009 A | 3/2006 |

* cited by examiner

Fig. 1

| 1-1 | 1_2 | 1_3 | 1_4 | 1_5 | 1_6 | 1_7 | 1_8 |
|---|---|---|---|---|---|---|---|
| BLK7 | BLK7 | BLK7 | BLK7 | BLK7 | BLK7 | BLK7 | BLK7 |
| BLK6 | BLK6 | BLK6 | BLK6 | BLK6 | BLK6 | BLK6 | BLK6 |
| BLK5 | BLK5 | BLK5 | BLK5 | BLK5 | BLK5 | BLK5 | BLK5 |
| BLK4 | BLK4 | BLK4 | BLK4 | BLK4 | BLK4 | BLK4 | BLK4 |
| BLK3 | BLK3 | BLK3 | BLK3 | BLK3 | BLK3 | BLK3 | BLK3 |
| BLK2 | BLK2 | BLK2 | BLK2 | BLK2 | BLK2 | BLK2 | BLK2 |
| BLK1 | BLK1 | BLK1 | BLK1 | BLK1 | BLK1 | BLK1 | BLK1 |
| BLK0 | BLK0 | BLK0 | BLK0 | BLK0 | BLK0 | BLK0 | BLK0 |
| SA/WD(2_1) | | SA/WD(2_2) | | SA/WD(2_3) | | SA/WD(2_4) | |
| PERIPHERY(3) | | | | | | | |
| SA/WD(2_8) | | SA/WD(2_7) | | SA/WD(2_6) | | SA/WD(2_5) | |
| BLK7 | BLK7 | BLK7 | BLK7 | BLK7 | BLK7 | BLK7 | BLK7 |
| BLK6 | BLK6 | BLK6 | BLK6 | BLK6 | BLK6 | BLK6 | BLK6 |
| BLK5 | BLK5 | BLK5 | BLK5 | BLK5 | BLK5 | BLK5 | BLK5 |
| BLK4 | BLK4 | BLK4 | BLK4 | BLK4 | BLK4 | BLK4 | BLK4 |
| BLK3 | BLK3 | BLK3 | BLK3 | BLK3 | BLK3 | BLK3 | BLK3 |
| BLK2 | BLK2 | BLK2 | BLK2 | BLK2 | BLK2 | BLK2 | BLK2 |
| BLK1 | BLK1 | BLK1 | BLK1 | BLK1 | BLK1 | BLK1 | BLK1 |
| BLK0 | BLK0 | BLK0 | BLK0 | BLK0 | BLK0 | BLK0 | BLK0 |
| 1_16 | 1_15 | 1_14 | 1_13 | 1_12 | 1_11 | 1_10 | 1_9 |

NONVOLATILE MEMORY DEVICE, STORAGE SYSTEM HAVING THE SAME, AND METHOD OF DRIVING THE NONVOLATILE MEMORY DEVICE

CROSS-REFERENCE TO RELATED APPLICATIONS

This is a continuation-in-part application based on pending application Ser. No. 12/453,420 (now allowed), filed May 11, 2009, now U.S. Pat. No. 7,817,465 which is a continuation of application Ser. No. 11/896,721, filed Sep. 5, 2007, now U.S. Pat. No. 7,548,451, the entire contents of all of which are hereby incorporated by reference.

BACKGROUND

1. Field

Embodiments relate to a nonvolatile memory device, a storage system having the same, and a method of driving the nonvolatile memory device, and more particularly, to a nonvolatile memory device having improved reliability of a read operation, a storage system including the nonvolatile memory device, and a method of driving the nonvolatile memory device.

2. Description of the Related Art

A phase Change Random Access Memory (PRAM) stores data using a phase change material, for example, a chalcogenide alloy. A state of the phase change material changes to a crystalline state or an amorphous state when the phase change material is heated or cooled. For example, when the phase change material is in a crystalline state, it may have a low resistance, and the crystalline state is defined as "set" or data "0." When the phase change material is in an amorphous state, it may have a high resistance, and the amorphous state is defined as "reset" or data "1."

A read operation of a PRAM may be described as follows. First, when a PRAM is to read, current may be applied to a selected cell, and pass through current that depends on the resistance of the PRAM is generated. A sense amplifier compares a level of a sensing node, which may change depending on the pass through current, with a reference level, and identifies data as "0" or "1."

However, a resistance of the PRAM may decrease as temperature rises. For example, a set resistance of 6 k$\Omega$ at 25° C. may change to 3.45 k$\Omega$ at 85° C., and a reset resistance of 150 k$\Omega$ at 25° C. may change to 50 k$\Omega$ at 85° C. The margin between the set resistance and the reset resistance may decrease because the decreasing extent of the reset resistance is higher than that of the set resistance; therefore, the sense amplifier may not correctly discriminate between the set state and the reset state. Further, in the case where the reset resistance greatly decreases, an operation error may occur in which the sense amplifier erroneously senses the reset state as the set state.

SUMMARY

Embodiments are therefore directed to nonvolatile memory devices, storage systems having the same, and methods of driving the nonvolatile memory device, which substantially overcome one or more of the problems due to the limitations and disadvantages of the related art.

It is a feature of an embodiment to provide a PRAM having a more reliable read operation than comparable conventional devices.

It is a separate feature of an embodiment to provide a PRAM adapted to control a resistance margin between a set resistance and reset resistance as temperature changes.

It is a separate feature of an embodiment to provide a PRAM adapted to control a resistance margin between a set state and a reset state with respect to a change in temperature by increasing an amount of compensation current or decreasing an amount of clamping current according to the change in temperature.

It is a separate feature of an embodiment to provide a PRAM adapted to maintain voltage conditions at a sensing node substantially and/or completely irrespective of temperature changes.

It is a separate feature of an embodiment to provide a temperature resistant PRAM that may include a compensation unit, a clamping unit, a compensation control signal generator, a clamping control signal generator, a temperature sensor, and/or a sense amplifier.

It is a separate feature of an embodiment to provide a nonvolatile memory device having improved reliability of a read operation.

It is a separate feature of an embodiment to provide a storage system including the nonvolatile memory device.

It is a separate feature of an embodiment to provide a method of driving the nonvolatile memory device having improved reliability of a read operation.

At least one of the above and other features and advantages may be realized by providing a nonvolatile memory device, including a memory cell array including a plurality of nonvolatile memory cells each having a resistance corresponding to one of a plurality of first resistance distributions, a temperature compensation circuit including one or more reference cells each having a resistance corresponding to one among one or more second resistance distributions, and a data read circuit including a compensation unit and a sense amplifier, the compensation unit being adapted to supply compensation current to a sensing node, an amount of the compensation current varying based on the resistance of each reference cell, and the sense amplifier being adapted to compare the level of the sensing node with a reference level and to output a comparison result.

The nonvolatile memory cells may be m-bit level cells, and each of the one or more reference cells has a resistance corresponding to one among $2^m-1$ second resistance distributions.

The number of the one or more reference cells is $2^m-1$, each of the $2^m-1$ reference cells form a reference set, and $2^m-1$ reference cells belonging to a same one of the reference sets may have resistances corresponding to different resistance distributions, respectively.

The memory cell array may be divided into a plurality of memory banks each divided into a plurality of memory blocks, and a corresponding one of the reference set may be arranged at each of the memory banks and/or each of the memory blocks.

The one of the second resistance distributions may be positioned between two adjacent ones among the plurality of first resistance distributions.

The temperature compensation circuit includes a reference write driver adapted to supply write current to the reference cells to determine resistances of the reference cells, and a reference read circuit adapted to supply read current to the reference cells to read resistances of the reference cells.

The memory device may include a write driver adapted to supply write current to the nonvolatile memory cells to determine resistances of the nonvolatile memory cells, wherein the reference write driver is a replica circuit of the write driver, and the reference read circuit is a replica circuit of the data read circuit.

The temperature compensation circuit may include an output node connected to the reference cells, the reference write driver, and the reference read circuit, and the node output outputs a compensation control signal.

The reference read circuit may include first and second transistors connected to each other in series between a boosting voltage and the output node, and a resistor array connected between the boosting voltage and a ground voltage, the resistor array generating first and second voltages, wherein the first voltage is to be applied to a gate of the first transistor, and the second voltage is to be applied to a gate of the second transistor.

Each of the reference cells may include a variable resistive element and an access element, the write driver passes through both the variable resistive element and the access element, and the read current passes through the variable resistive element and selectively passes through the access element.

The compensation current may compensate for a reduction in a level of the sensing node as a result of current flowing through a selected nonvolatile memory cell of the nonvolatile memory cell array.

The memory device may include a clamping unit coupled between a bit line coupled to the selected nonvolatile memory cell and the sensing node and adapted to control an amount of clamping current flowing from the sensing node into the bit line according to the resistances of the reference cells.

The memory device may be electrically coupled to a processor of a storage system, wherein the processor is adapted to control write and read operations of the nonvolatile memory device.

The nonvolatile memory device may be a phase change random access memory (PRAM) device.

The data read circuit may include a clamping unit, the clamping unit being coupled to a bit line coupled to the selected nonvolatile memory cell and the sensing node and being adapted to control an amount of clamping current flowing from the sensing node into the bit line according to resistances of the reference cells.

The nonvolatile memory cells may be m-bit level cells, and each of the one or more reference cells may have a resistance corresponding to one of $2^m-1$ second resistance distributions.

The temperature compensation circuit may include a reference write driver adapted to supply write current to the reference cells to determine resistances of the reference cells, and a reference read circuit adapted to supply read current to the reference cells to read resistances of the reference cells.

The memory device may include a write driver adapted to supply write current to the nonvolatile memory cells to determine resistances of the nonvolatile memory cells, wherein the reference write driver is a replica circuit of the write driver, and the reference read circuit is a replica circuit of the data read circuit.

At least one of the above and other features and advantages may be separately realized by providing a method of driving a nonvolatile memory device, the method including supplying a memory cell array comprising m-bit (where m is a natural number) level cells and a reference set comprising $2^m-1$ reference cells, writing data to the $2^m-1$ reference cells belonging to the reference set so that the 2m-1 reference cells have resistances respectively corresponding to different resistance distributions, writing data to the m-bit level cells, and supplying current varying according to the resistances of the $2^m-1$ reference cells to the m-bit level cells to read the data from the m-bit level cells.

Between writing the data to the $2^m-1$ reference cells and the writing of the data to the m-bit level cells, the method may further include reading the resistances of the $2^m-1$ reference cells.

Additional aspects and/or advantages of the invention will be set forth in part in the description which follows and, in part, will be obvious from the description, or may be learned by practice of the invention.

BRIEF DESCRIPTION OF THE DRAWINGS

The above and other features and advantages will become more apparent to those of ordinary skill in the art by describing in detail exemplary embodiments with reference to the attached drawings, in which:

FIG. 1 illustrates a block diagram of an exemplary arrangement of memory cells a phase change random access memory (PRAM) according to an exemplary embodiment;

DETAILED DESCRIPTION

Figure 2:
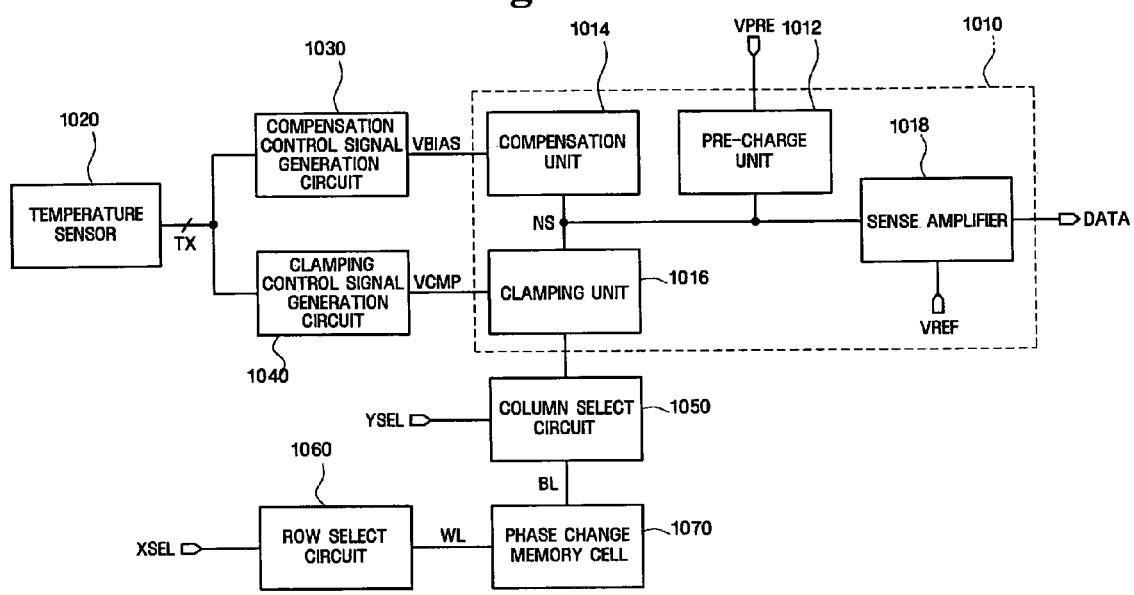
FIG. 2 illustrates a block diagram of exemplary driving blocks for driving the memory cells of the PRAM of FIG. 1.

Korean Patent Application No. 10-2009-0101262, filed on Oct. 23, 2009, in the Korean Intellectual Property Office, and entitled: "Nonvolatile Memory Device, Storage System Having the Same, and Method of Driving the Nonvolatile Memory Device," is incorporated by reference herein in its entirety. The contents of U.S. Pat. No. 7,245,605 (relating to write verify), U.S. Pat. No. 6,982,913 (relating to 2-step precharge), U.S. Pat. No. 7,215,592 (relating to global bitline), U.S. Pat. No. 7,315,469, and U.S. Patent Publication Nos. 2007/0236987 and 2008/0123389, which relate to nonvolatile memory devices, are incorporated by reference herein in their entireties.

Advantages and features and methods of accomplishing the same may be understood more readily by reference to the following detailed description of exemplary embodiments and the accompanying drawings. Features may, however, be embodied in many different forms and should not be construed as being limited to the embodiments set forth herein. Rather, these embodiments are provided so that this disclosure will be thorough and complete and will fully convey the concept of the invention to those skilled in the art, and the present invention will only be defined by the appended claims. Thus, in some embodiments, well-known methods, procedures, components, and circuitry have not been described in detail to avoid unnecessarily obscuring aspects.

It will be understood that, although the terms first, second, etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, a first element, component, region, layer or section discussed below could be termed a second element, component, region, layer or section without departing from the teachings. In addition, it will also be understood that when an element is referred to as being "between" two elements, it can be the only element between the two elements, or one or more intervening elements may also be present. Like reference numerals refer to like elements throughout the specification.

The terminology used herein is for the purpose of describing particular embodiments only and is not intended to be limiting of the invention. As used herein, the singular forms "a," "an" and "the" are intended to include the plural forms as well, unless the context clearly indicates otherwise. It will be further understood that the terms "comprises," "comprising," "includes" and/or "comprising," when used in this specification, specify the presence of the stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Exemplary embodiments will hereinafter be described in detail, taking a phase-change random access memory (PRAM) device as an example. However, embodiments are not restricted to PRAM devices, and may also be applied to other nonvolatile memory devices using resistance materials including, e.g., a resistive random access memory (RRAM) device, a magnetic random access memory (MRAM) device, etc.

FIG. 1 illustrates a block diagram of an exemplary arrangement of memory cells a phase change random access memory (PRAM) according to an exemplary embodiment. Although FIG. 1 illustrates a PRAM having 16 memory banks, exemplary embodiments are not limited thereto. Referring to FIG. 1, a PRAM may include a memory cell array, a plurality of sense amplifiers SA2_1 to SA2_8, and write drivers WD2_1 to WD2_8, and a peripheral circuit region 3.

The memory cell array may include a plurality of memory banks 1_1 to 1_16. Each of the plurality of memory banks 1_1 to 1_16 may include a plurality of memory blocks BLK0 to BLK7. Each of the plurality of memory blocks BLK0 to BLK7 may include a plurality of phase change memory cells 70 (see, e.g., FIGS. 2 and 3) arranged in a matrix form (not shown). In the exemplary embodiment of FIG. 1, eight memory blocks are arranged in each of the plurality of memory banks 1_1 to 1_16, however, embodiments are not limited thereto. The phase change memory cell 70 may include a variable resistive element including a phase change material having multiple, e.g., two, different resistance values depending on whether the phase change material is in a crystalline state or an amorphous state, and an access element adapted to control current flow through the variable resistive element. The access element may be a diode or a transistor coupled in series to the variable resistive element. Furthermore, the phase change material may include a compound element, e.g., GaSb, InSb, InSe, $Sb_2Te_3$, GeTe, GeTe, GeSbTe, GaSeTe, InSbTe, $SnSb_2Te_4$, InSbGe, AnInSbTe, (GeSn) SbTe, GeSb(SeTe) and $Te_{81}Ge_{15}Sb_2S_2$. More particularly, e.g., the phase change material may be GeSbTe, composed of Ge, Sb and Te.

Embodiments may include row select circuits (60, see FIG. 2) and/or column select circuits (50, see FIG. 2) for respectively assigning rows and columns of the phase change memory cells 70 to write and/or read data corresponding to the memory banks 1_1 to 1_16.

Each of the sense amplifiers and write drivers 2_1 to 2_8 may be arranged to correspond to one or more, e.g., two, of the memory banks 1_1 to 1_16 and may perform read and write operations in the corresponding memory banks. Although in FIG. 1 each of the sense amplifiers and write drivers 2_1 to 2_8 are associated with two corresponding ones of the memory banks 1_1 to 1_16, exemplary embodiments may not be limited thereto. The sense amplifiers and write drivers 2_1 to 2_8 may be configured to correspond to one memory bank or more than two memory banks.

A plurality of logic circuit blocks (not shown) and a voltage generator (not shown) for operating the column select circuits 50, the row select circuits 60, and the sense amplifiers and write drivers 2_1 to 2_8 may be arranged in the peripheral circuit region 3. A temperature sensor 20 (FIG. 2), a compensation control signal generation circuit 30 (FIG. 2), and a clamping control signal generation circuit 40 (FIG. 2) may also be arranged in the peripheral circuit region 3, which will be further described below.

Figure 3:
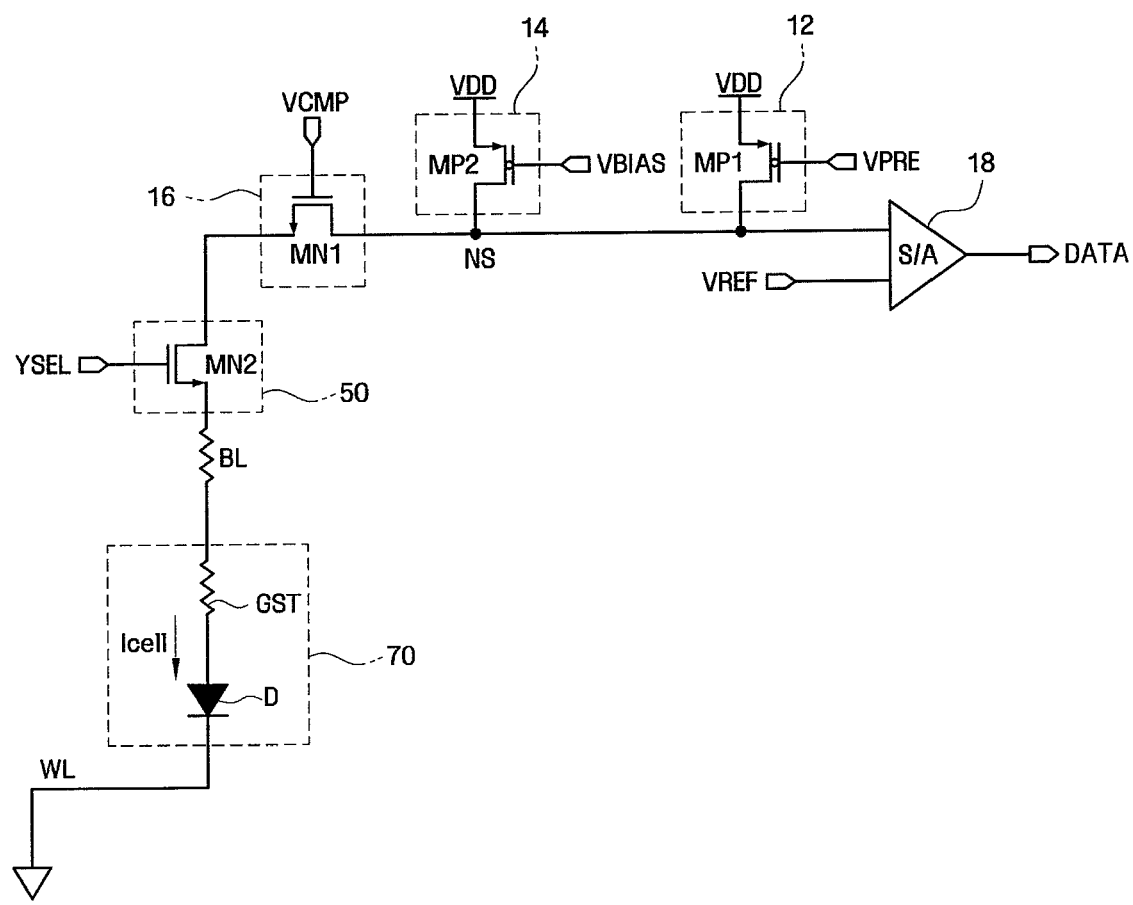
FIG. 3 illustrates a circuit diagram of a portion of the driving blocks of FIG. 2.

FIG. 2 illustrates a block diagram of exemplary driving blocks for driving the memory cells of the PRAM of FIG. 1. FIG. 3 illustrates a circuit diagram of a portion of the driving blocks of FIG. 2.

Referring to FIGS. 2 and 3, the PRAM may include a data read circuit 10, a temperature sensor 20, a compensation control signal generation circuit 30, a clamping control signal generation circuit 40, a column select circuit 50, a row select circuit 60, and a phase change memory cell 70.

One of the phase change memory cells 70 may be selected in the memory cell array, for example, for a read operation. In more detail, the column select circuit 50 may include an n-type metal-oxide-semiconductor (NMOS) transistor MN2 and may be provided with a column select signal YSEL, e.g., at gate of the transistor MN2. The column select circuit 50 may select a bit line BL corresponding to the memory cell 70 being selected. The row select circuit 60 may be provided with a row select signal XSEL. The row select circuit 60 may select a word line WL corresponding to the memory cell 70 being selected. The selected bit line BL and world line WL may result in reading data from the selected phase change memory cell 70.

The data read circuit 10 may read data by applying current to the selected phase change memory cell 70 and sensing a level change at a sensing node NS generated by pass through current Icell flowing through the selected phase change memory cell 70.

The data read circuit 10 may include a pre-charge unit 12, a compensation unit 14, a clamping unit 16, and a sense amplifier 18.

The pre-charge unit 12 may pre-charge the sensing node NS to a desired level. For example, the pre-charge unit 12 may pre-charge a level of a power supply voltage VDD during a pre-charge period before a sensing operation. The pre-charge unit 12 may include a p-type metal-oxide-semiconductor (PMOS) transistor MP1 coupled between a power voltage VDD and the sensing node SN, and may receive a pre-charge control signal VPRE through a gate of the transistor MP1.

The compensation unit 14 may provide the sensing node NS with compensation current in order to compensate for a level reduction at the sensing node SN, which may be caused by the pass through current Icell flowing through the selected phase change memory cell 70. In detail, when the phase change memory cell 70 is in a set state, the pass through current Icell may be high because the phase change material has a low resistance. In contrast, when the phase change memory cell 70 is in a reset state, the pass through current Icell may be low because the phase change material has a high resistance.

The amount of the compensation current provided by the compensation unit 14 may reach a level to compensate for the pass through current Icell in a reset state. By doing so, the level of the sensing node NS corresponding to a reset state may be kept constant, while the level of the sensing node NS corresponding to a set state may be lowered. Accordingly, since a difference between the level of the sensing node NS in a reset state and the level of the sensing node NS in a set state may be relatively large, it may be easier to discriminate between the set and reset states. More particularly, e.g., as voltage levels at the sensing node NS may be at least partially compensated for by the compensation unit 14, a sensing margin may be maintained and/or increased as compared, e.g., to cases not employing the compensation unit 14. The compensation unit 14 may include a PMOS transistor MP2 coupled between the power supply voltage VDD source and the sensing node SN, and may receive a compensation control signal VBIAS through a gate of the PMOS transistor MP2.

The clamping unit 16 may function to clamp a level of the bit line BL within a range appropriate for reading data. In detail, the clamping unit 16 may perform clamping below a threshold voltage Vth of the phase change material. When a level above the threshold voltage Vth is reached, a phase of the phase change material of the selected phase change memory cell 70 may change. The clamping unit 16 may be an NMOS transistor MN1 that is coupled between the bit line BL and the sensing node NS and may receive a clamping control signal VCMP through a gate of the transistor MN1, as illustrated in FIG. 3.

The sense amplifier 18 may compare the level of the sensing node NS with a reference level REF, and may output results of the comparison. In an exemplary embodiment, the sense amplifier 18 may be a current sense amplifier that senses a change in current flowing out from the bit line BL of the selected phase change memory cell 70 with respect to a reference current, or a voltage sense amplifier that senses a change in voltage with respect to a reference voltage.

In some embodiments, the compensation unit 14 may control an amount of the compensation current according to a change in temperature. In some embodiments, the clamping unit 16 may control a level of the bit line BL that is clamped according to a change in temperature. In other words, the clamping unit 16 may control an amount of clamping current flowing into the bit line BL coupled to the phase change memory cell 70 selected from the sensing node NS according to a change in temperature.

Figure 4:
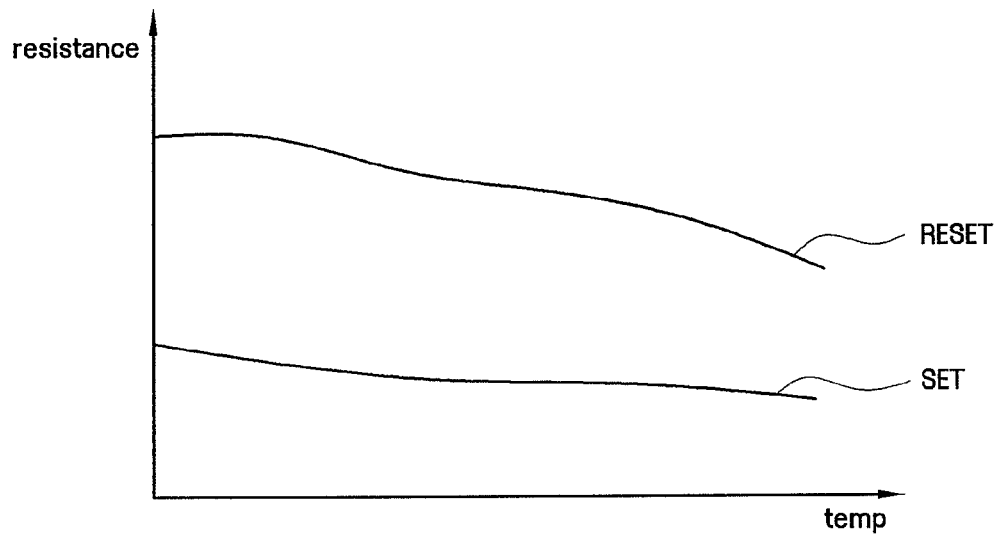
FIG. 4 illustrates a graph showing a relationship between resistance and temperature of a phase change material.
Figure 5:
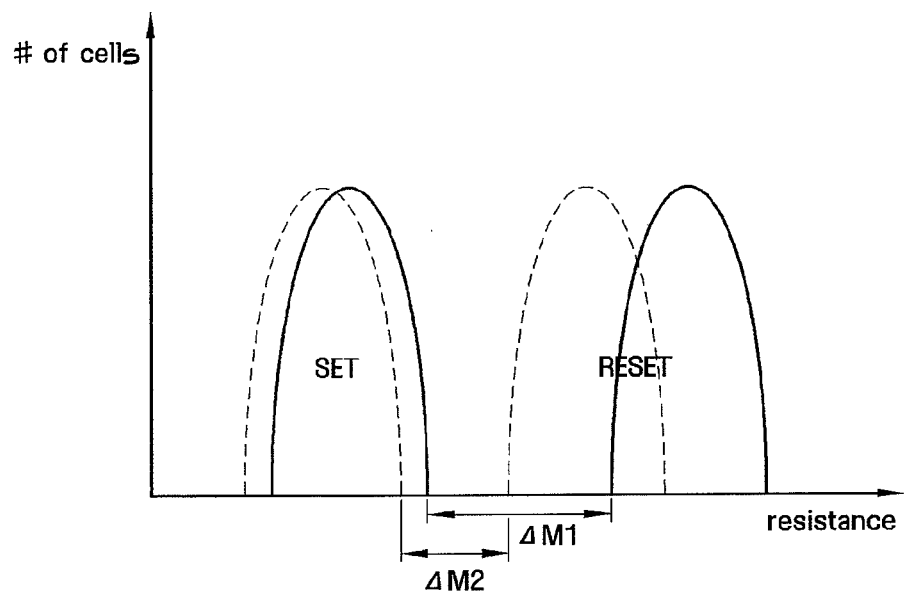
FIG. 5 illustrates a graph of set and reset resistance distributions of a phase change memory cell based on changes in temperature.
Figure 6:
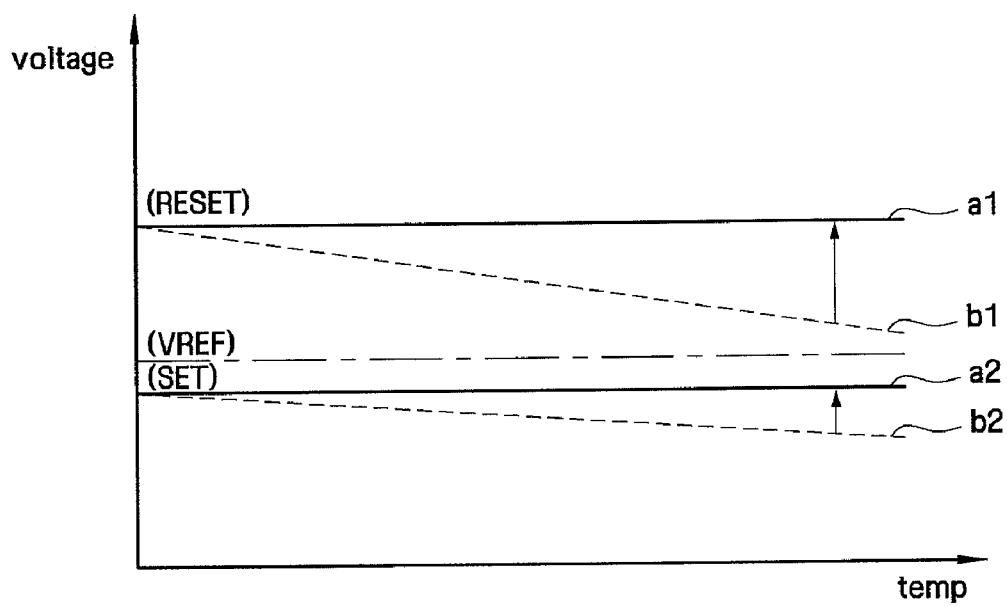
FIG. 6 illustrates a graph of a relationship between changes in temperature and changes in a voltage level of a sensing node.

FIG. 4 illustrates a graph showing a relationship between resistance and temperature of a phase change material. FIG. 5 illustrates a graph of set and reset resistance distributions of a phase change memory cell based on a change in temperature. FIG. 6 illustrates a graph of a relationship between changes in temperature and changes in a voltage level of a sensing node.

As temperature rises, set resistance and reset resistance of a phase change material may decrease, as illustrated in FIG. 4. For example, the phase change material may have a set resistance of 6 kΩ and 3.45 kΩ at 25° C. and 85° C., respectively, and a reset resistance of 150 kΩ and 50 kΩ at 25° C. and 85° C., respectively. As illustrated in FIG. 4, as temperature rises, an extent of a decrease in the reset resistance may be greater than an extent of a decrease in the set resistance. As shown in FIG. 5, if a margin between the set resistance and the reset resistance is ΔM1 at ambient temperature, a margin between the set resistance and the reset resistance decreases to ΔM2 at a temperature higher than ambient temperature.

Furthermore, since the set resistance and the reset resistance decrease as temperature rises, the pass through current Icell, which depends on the resistance of the phase change material, increases as temperature rises. Accordingly, when temperature rises, a level of the sensing node NS corresponding to a set state and a level of the sensing node NS corresponding to a reset state decrease, as illustrated in FIG. 6.

In FIG. 6, the X-axis and the Y-axis respectively represent temperature and the voltage level of the sensing node SN, "a1" and "a2" respectively indicate the level of the sensing node NS in a reset state and the level of the sensing node NS in a set state at ambient temperature, and "b1" and "b2" respectively indicate the level of the sensing node NS in a reset state and the level of the sensing node NS in a set state at a temperature higher than ambient temperature. As illustrated in FIG. 6, the margin between the level of the sensing node NS in a set state and the level of the sensing node NS in a reset state decreases as temperature rises. Accordingly, the sense amplifier 18 may not correctly discriminate between a set state and a reset state, and therefore, may generate an operation error such that the sense amplifier 18 may sense a reset state instead of a set state.

Accordingly, embodiments may include the compensation unit 14 and/or the clamping unit 16. As temperature rises, the compensation unit 14 may adjust, e.g., increase, an amount of compensation current and/or the clamping unit 16 may adjust, e.g., decrease, an amount of clamping current. In view of a decrease in voltage at the sensing node NS as a result of, e.g., an increase in temperature, the compensation unit 14 may provide compensation current to increase a voltage at the sensing node SN. Furthermore, e.g., in view of a decrease in voltage at the sensing node NS as a result of, e.g., an increase in temperature, an amount of pass through current decreases when the clamping unit 16 decreases the clamping current, it may be possible to raise a level of the sensing node SN, as indicated by the arrows in FIG. 6. Thus, in some embodiments, even if the amount of pass through current, which may depend on the resistance of the phase change material, increases, the compensation unit 14 and/or the clamping unit 16 may be driven to partially and/or completely compensate for the decrease in voltage at the sensing node NS due to, e.g., the increase in temperature. Thus, referring to FIG. 6, embodiments may enable the level of the sensing node NS to be adjusted, e.g., increased, so as to maintain voltage conditions at the sensing node NS corresponding to, e.g., set and reset states, irrespective of temperature. That is, embodiments may enable a margin between a level of the sensing node NS in a set state and a level of the sensing node in a reset state to be maintained irrespective of temperature. Accordingly, embodiments may enable operational errors of the sense amplifier 18 to be reduced, and reliability of the PRAM to be enhanced.

A detailed example of an increase in the amount of compensation current and a decrease in the amount of clamping current will be described below.

Referring to FIGS. 2 and 3, the PRAM may include a temperature sensor 20 that may react to ambient temperature and provide a temperature signal Tx. A compensation control signal generation circuit 30 and a clamping control signal generation circuit 40 may each receive the temperature signal Tx, and respectively generate a compensation control signal VBIAS and a clamping control signal VCMP, reflecting the temperature characteristics. In detail, when the temperature rises, the compensation control signal generation circuit 30 and the clamping control signal generation circuit 40 may decrease the voltage level of the compensation control signal VBIAS and the voltage level of the clamping control signal VCMP, respectively.

Referring to FIG. 3, when the voltage level of the compensation control signal VBIAS decreases, the PMOS transistor of the compensation unit 14 may decrease an amount of compensation current. When the voltage level of the clamping control signal VCMP decreases, the NMOS transistor MN1 of the clamping unit 16 may decrease the amount of clamping current.

Figure 7:
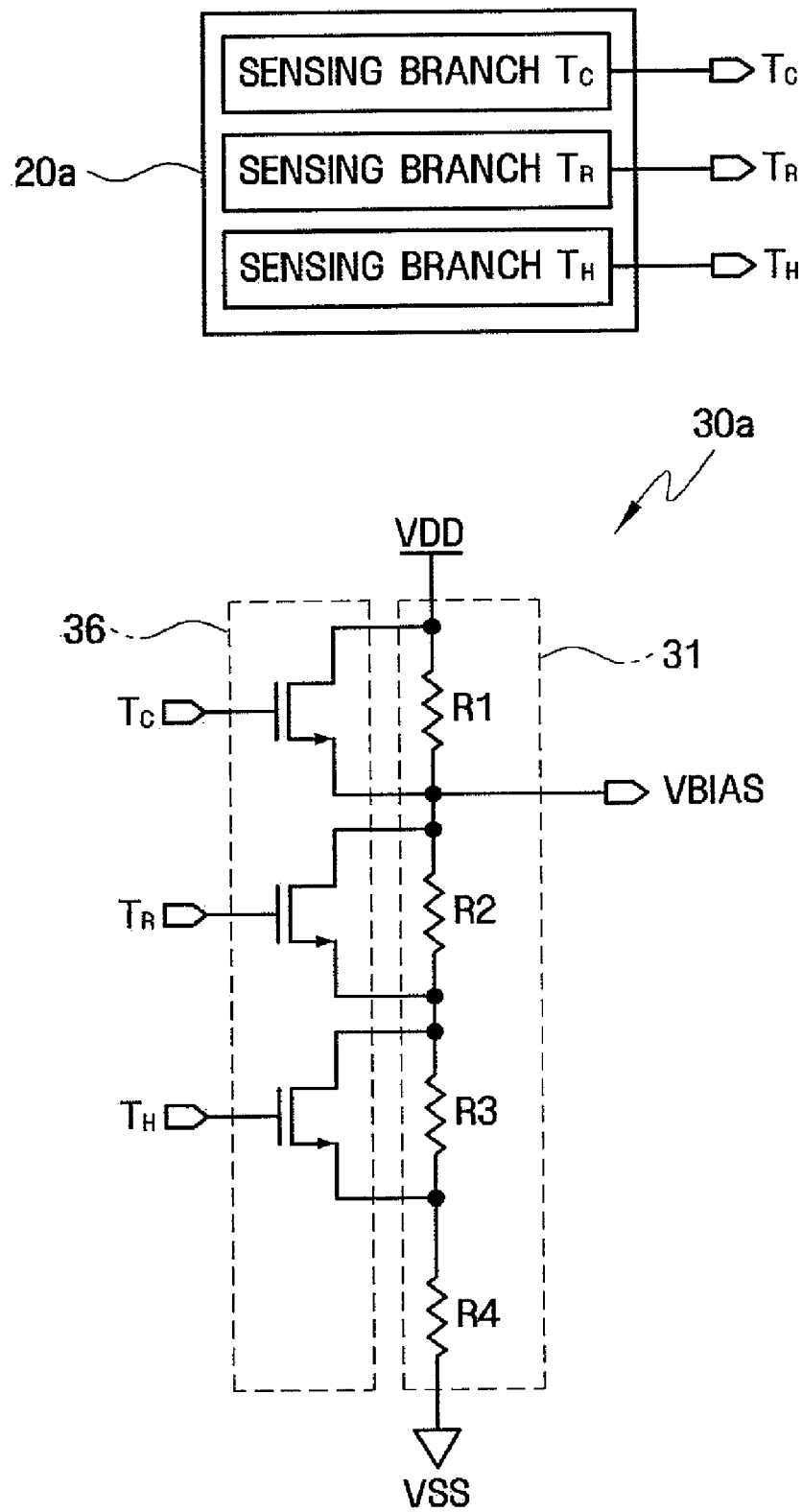
FIGS. 7, 8, and 9 illustrate circuit diagrams of exemplary embodiments a temperature sensor and a compensation control signal generation circuit employable by the PRAM illustrated in FIG. 2.
Figure 8:
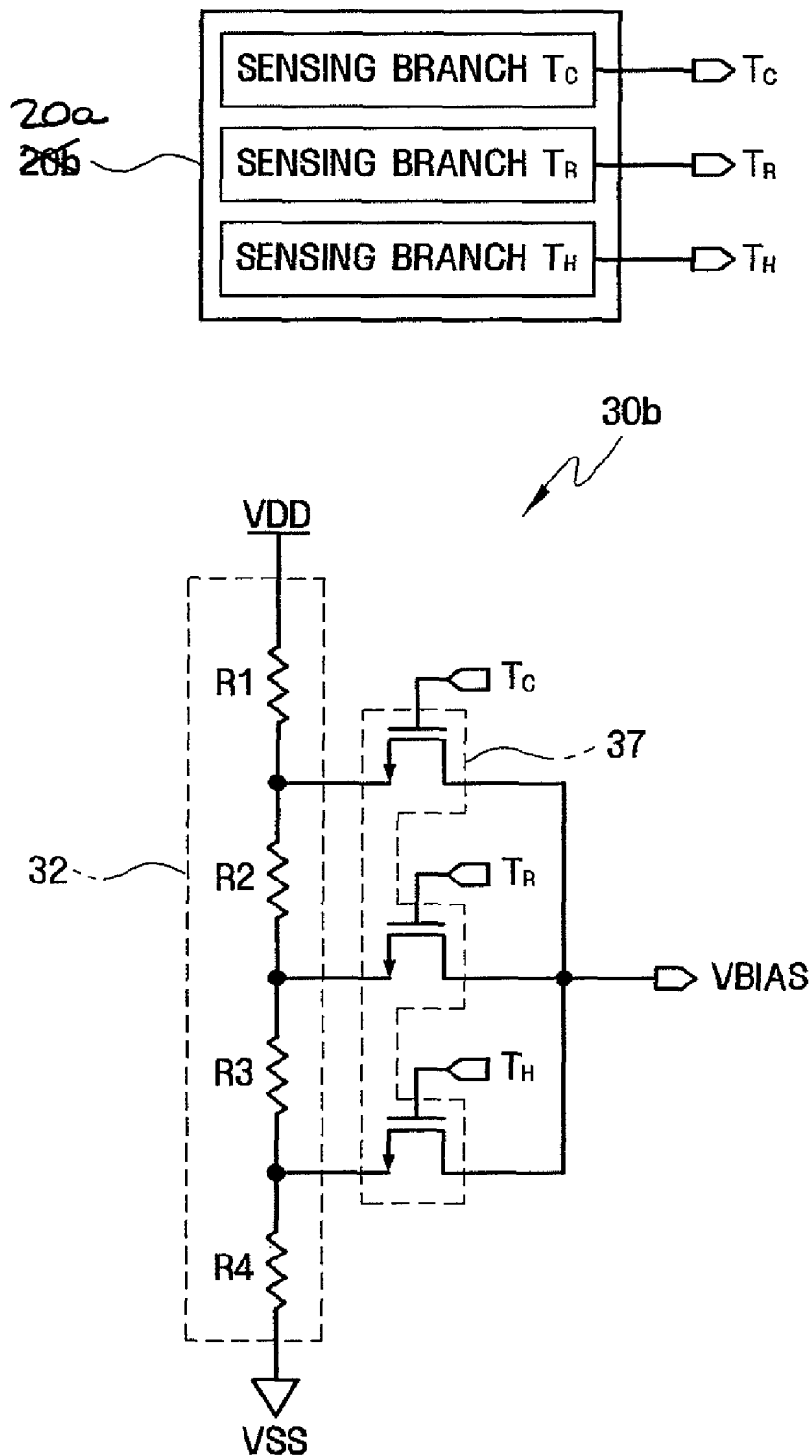
Figure 9:
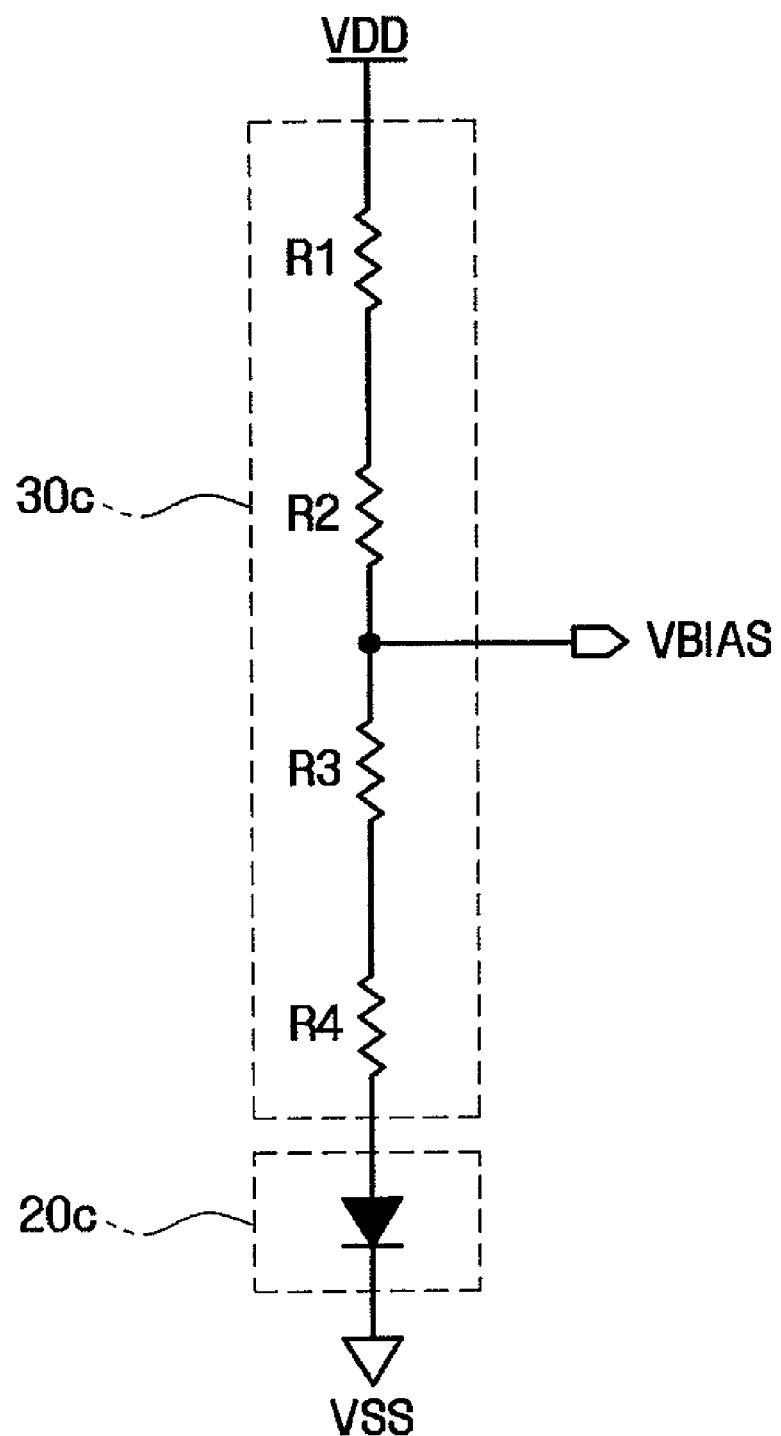

FIGS. 7, 8, and 9 illustrate circuit diagrams of exemplary embodiments the temperature sensor 20 and the compensation control signal generation circuit 30 employable by the PRAM illustrated in FIG. 2. Although FIGS. 7, 8, and 9 illustrate the compensation control signal generation circuit 30, the exemplary circuits illustrated in FIGS. 7, 8, and 9 may also be applied to the clamping control signal generation circuit 40. Embodiments are not limited thereto, as the circuits shown in FIGS. 7, 8, and 9 are only for illustrative purposes.

Referring to FIG. 7, a temperature sensor 20a may include a plurality of temperature sensing branches which react to different temperatures and output temperature signals TR, TH and TC. For example, the temperature sensor 20a may include a sensing branch TR for sensing ambient temperature, a sensing branch TH for sensing a temperature higher than ambient temperature, and a sensing branch TC for sensing a temperature lower than ambient temperature. When temperature of the PRAM becomes higher than ambient temperature, the temperature signal TH becomes high, and the temperature signal TC becomes low.

The compensation control signal generation circuit 30a may include a resistor array 31 configured to have a plurality of resistors R1, R2, R3, R4, and a plurality of NMOS transistors 36 connected between a plurality of nodes of the resistor array 31, and configured to be turned on in response to the temperature signals TR, TH and TC. For example, values of the plurality of resistors R1, R2, R3, R4 may be such that R1<R2<R3<R4. The level of the compensation control signal VBIAS output in response to the temperature signal TH may be lower than that of compensation control signal VBIAS output in response to the other temperature signals TR and TC.

Referring to FIG. 8, in some embodiments, e.g., the temperature sensor 20a of FIG. 7 may be employed with a compensation control signal generation circuit 30b. The temperature sensor 20a may include the sensing branches TR, TR and TC, which may output temperature signals TR, TH and TC, respectively, in response to different temperatures. The compensation control signal generation circuit 30b may include a resistor array 32 configured to include a plurality of resistors R1, R2, R3, R4, and a plurality of NMOS transistors 37. The NMOS transistors 37 may be connected between a plurality of nodes of the resistor array 32 and a voltage output node, and may be configured to be turned on in response to the temperature signals TR, TH, TC. The compensation control signal generation circuit 30b may output a compensation control signal VBIAS.

Referring to FIG. 9, in some embodiments, the PRAM may include a temperature sensor 20c and a compensation control signal generation circuit 30c. The temperature sensor 20c may include a diode. The compensation control signal generation circuit 30c may include a resistor array in which a plurality of resistors R1 to R4 may be connected in a series. The diode and the plurality of resistors may be connected in a series with respect to each other. Since the resistance of the diode may become high when temperature rises, the level of the compensation control signal VBIAS may decrease when temperature rises.

Figure 10:
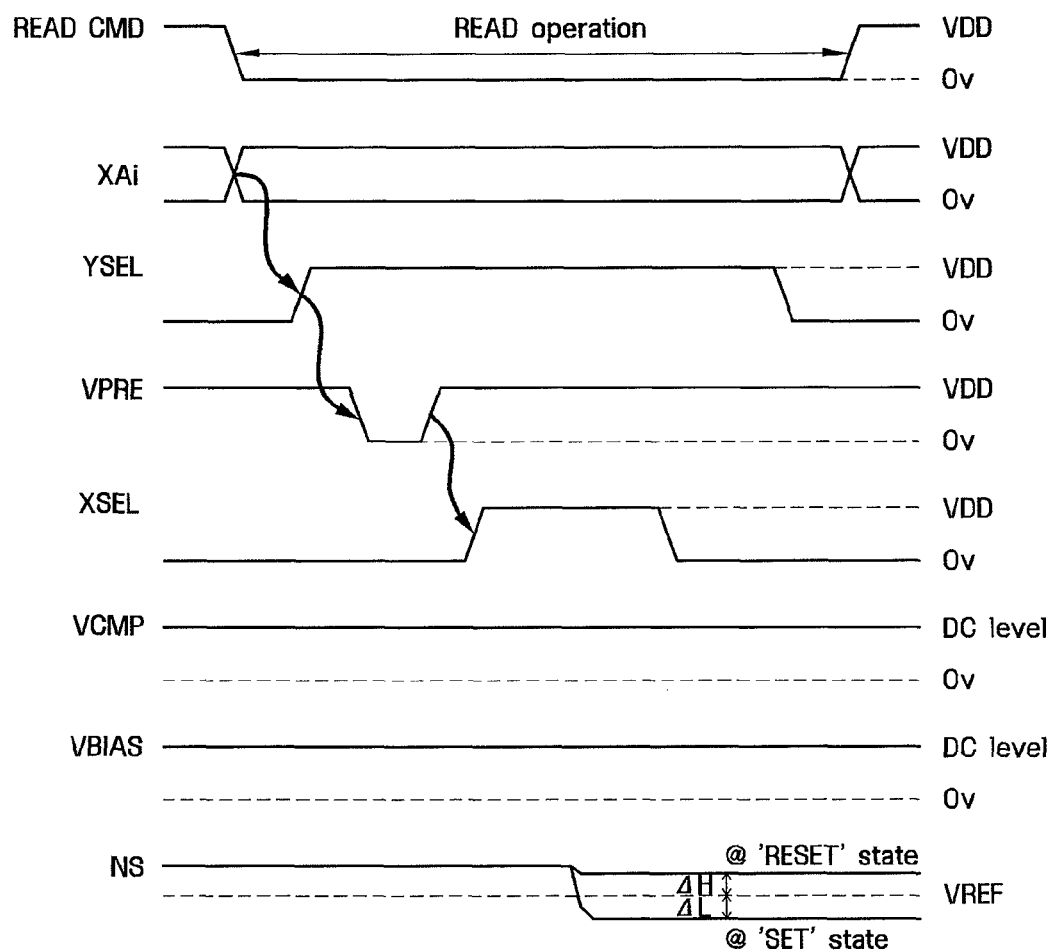
FIG. 10 illustrates a timing diagram of a read operation of the PRAM according to an exemplary embodiment.

FIG. 10 illustrates a timing diagram of a read operation of a PRAM according to an exemplary embodiment.

A read operation may be performed when temperature of the PRAM is higher than ambient temperature.

First, a read operation may start in response to an input of a read command, a column select signal YSEL may become high in synchronization with an input address XAi, and a bit line BL may be selected.

Subsequently, a pre-charge control signal VPRE may become low in synchronization with the column select signal YSEL. Accordingly, the transistor MP1 of the pre-charge unit 12 may pre-charge the sensing node NS to the level of the power supply voltage VDD.

Thereafter, when the pre-charge control signal VPRE becomes high, the row select signal XSEL may become high in synchronization with the pre-charge control signal so that a word line WL may be selected.

Further, when the pre-charge operation is terminated and a sensing operation starts, the clamping unit 16 may clamp the level of the bit line BL within a region appropriate for reading data. In detail, the clamping unit 16 may clamp the level of the bit line BL to a desired level below the threshold voltage Vth of the phase change material. For example, when the threshold voltage of the phase change material is about 1.2 V, the level of the bit line BL may be clamped at about 0.5 V to 1.0 V. The clamping unit 16 may provide clamping current lower than that provided at ambient temperature. Although a clamping control signal VCMP may be in the form of a constant voltage, as illustrated in FIG. 10, the clamping control signal VCMP may be in the form of a pulse which may be activated only during a read operation.

Furthermore, the compensation unit 14 may provide the sensing node NS with compensation current in order to compensate for a level reduction of the sensing node SN, which is caused by the pass through current Icell flowing through the selected phase change memory cell 70. In some embodiments, the compensation unit 14 may provide an amount of compensation current which may be larger than that provided at ambient temperature. Although the compensation control signal VBIAS may be in the form of a constant voltage, as illustrated in FIG. 10, the compensation control signal VBIAS may be in the form of a pulse type which may be activated only during the read operation.

In such a state, pass through current Icell depending on the resistance of the selected phase change memory cell 70 may be generated. When the phase change memory cell 70 is in a set state, the amount of the pass through current Icell may be large because the resistance of the phase change material is low. In contrast, when the phase change memory cell 70 is in a reset state, the amount of the pass through current Icell may be small because the resistance of the phase change material is high. However, since the compensation unit 14 may uniformly provide the compensation current, the level of the sensing node NS may be uniformly maintained in a reset state, and may decrease in a set state. Accordingly, the sense amplifier 18 may sense the difference ΔH between the level of the sensing node NS in a reset state and a reference level VREF, or the difference ΔL between the level of the sensing node NS in a set state and the reference level VREF.

According to an exemplary embodiment, it may be noted that in some embodiments, as temperature rises, the compensation unit 14 may increase the amount of compensation current and/or the clamping unit 16 may decrease the amount of clamping current so that the level of the sensing node NS in a reset state may be uniformly maintained.

Figure 11:
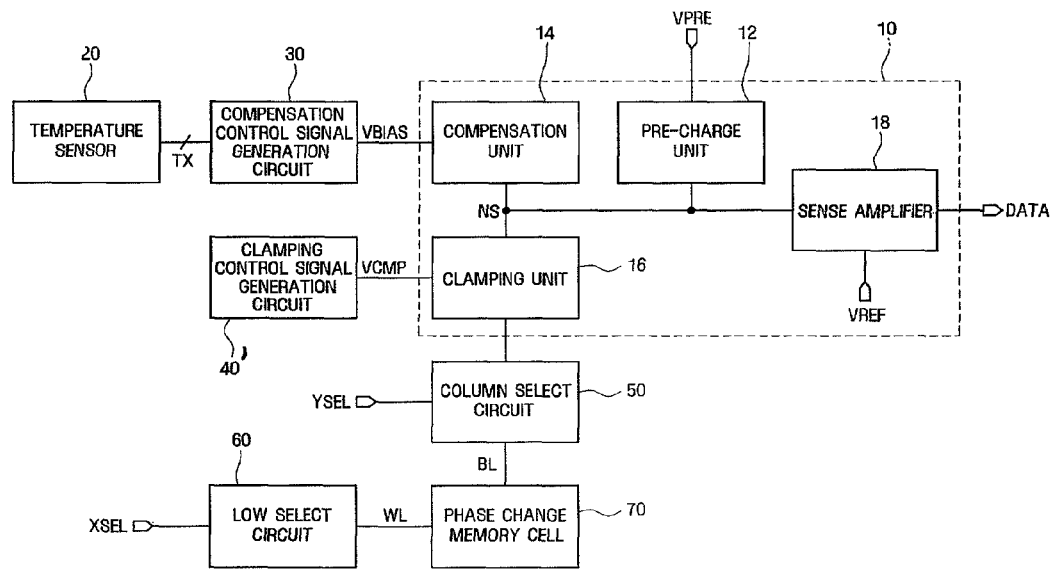
FIG. 11 illustrates a block diagram illustrating a PRAM according to another exemplary embodiment.
Figure 12:
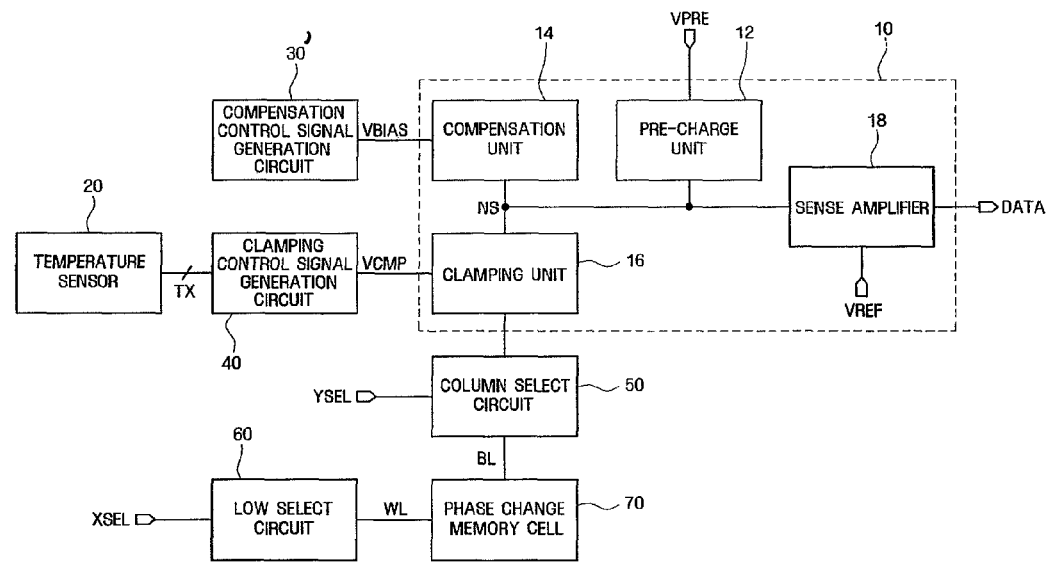
FIG. 12 illustrates a block diagram of a PRAM according to yet another exemplary embodiment.

FIG. 11 illustrates a block diagram of a PRAM according to another exemplary embodiment. FIG. 12 illustrates a block diagram of a PRAM according to yet another exemplary embodiment. In general, only differences between the exemplary PRAMs of FIGS. 11 and 12 and the exemplary PRAM of FIG. 2 will be described below.

In the exemplary PRAM of FIG. 11, the compensation control signal generation circuit 30 may receive the temperature signal Tx from the temperature sensor 20, and may control an amount of compensation current according to the change in temperature. In the exemplary PRAM of FIG. 11, a clamping control signal generation circuit 40' is not coupled so as to receive the temperature signal Tx from the temperature sensor 20. Thus, in the exemplary embodiment of FIG. 11, only the compensation control signal generation circuit 30 may control characteristics of the sensing node NS based on temperature, e.g., by controlling an amount of compensation current according to a change in temperature.

In the exemplary PRAM of FIG. 12, the clamping control signal generation circuit 40 may receive the temperature signal Tx from the temperature sensor 20, and may control an amount of compensation current according to the change in temperature. In the exemplary PRAM of FIG. 12, a compensation control signal generation circuit 30' may not be coupled so as to receive the temperature signal Tx from the temperature sensor 20. Thus, in the exemplary embodiment of FIG. 12, only the clamping control signal generation circuit 40 may control characteristics of the sensing node NS based on temperature, e.g., by controlling an amount of clamping current according to a change in temperature.

Embodiments employing one or more features described herein may provide a PRAM having a more reliable read operation than comparable conventional devices. More particularly, as the temperature of the PRAM increases, a set resistance and reset resistance may change, and thus, a resistance margin between the set resistance and reset resistance may be small. Embodiments of a PRAM employing one or more features described herein may include a compensation unit, a clamping unit, a compensation control signal generator, a clamping control signal generator, a temperature sensor, and/or a sense amplifier. The compensation unit may control the amount of compensation current according to the temperature of the PRAM in response to a compensation control signal. The compensation control signal generator may control the voltage level of the compensation control signal by receiving the temperature signal from the temperature sensor. The clamping unit may control the amount of clamping current according to the temperature of the PRAM in response to a clamping-control signal. The clamping control signal generator may control the voltage level of the clamping control signal by receiving the temperature signal from the temperature sensor.

Embodiments of PRAMs described above may ensure a margin between a set state and a reset state with respect to a change in temperature by increasing the amount of compensation current or decreasing the amount of clamping current according to the change in temperature. Accordingly, it may be possible to decrease the number of operational errors of the sense amplifier caused by the temperature change, and to enhance the reliability of the read operation of the PRAM.

Figure 13A:
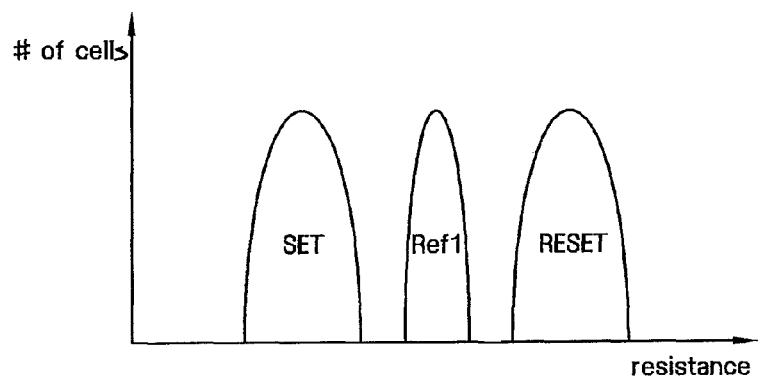
FIGS. 13A and 14 illustrate graphs diagramming set and reset resistance margins of a single level cell.
Figure 13B:
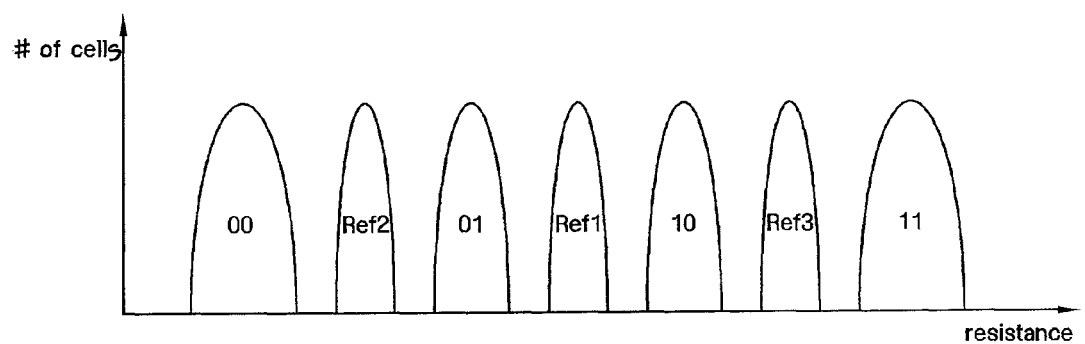
FIGS. 13B and 15 illustrate graphs diagramming set and reset resistance margins of a multi-level cell.
Figure 14:
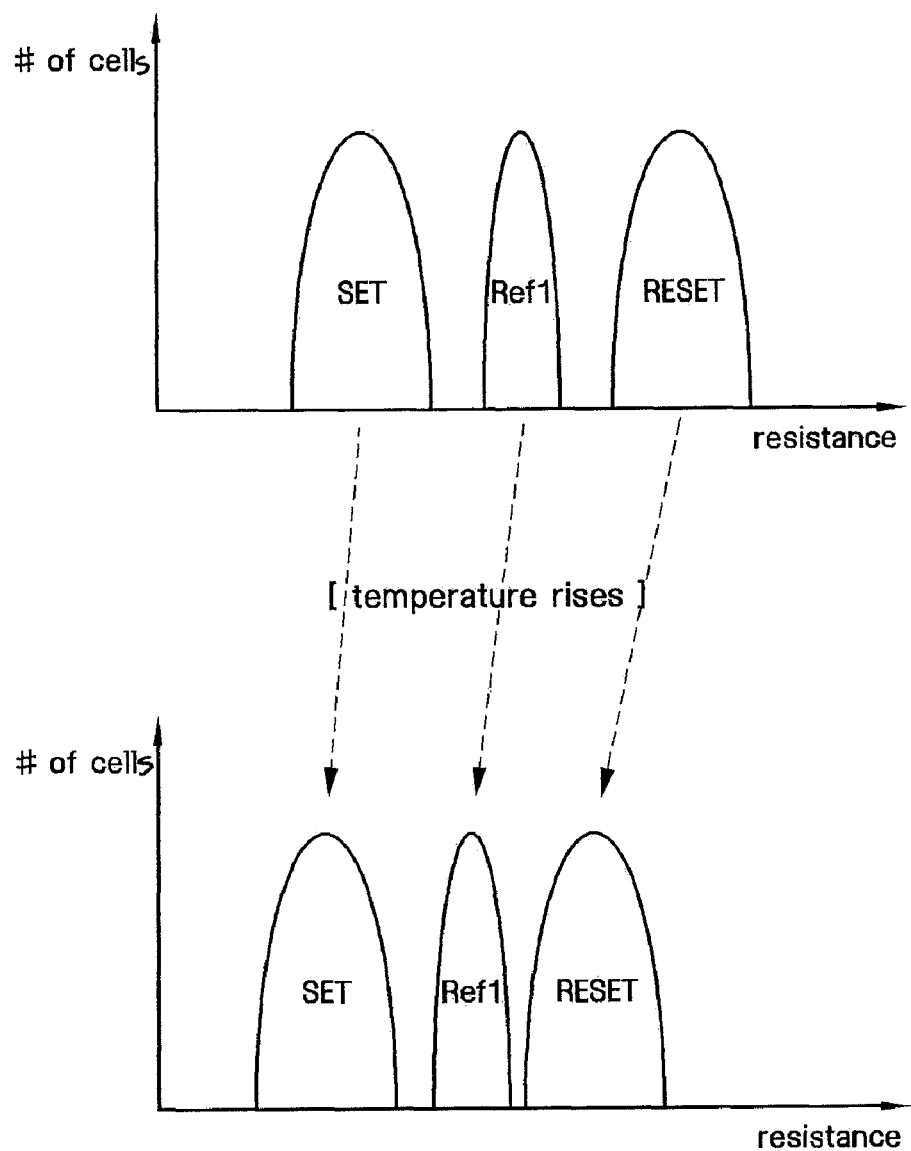
Figure 15:
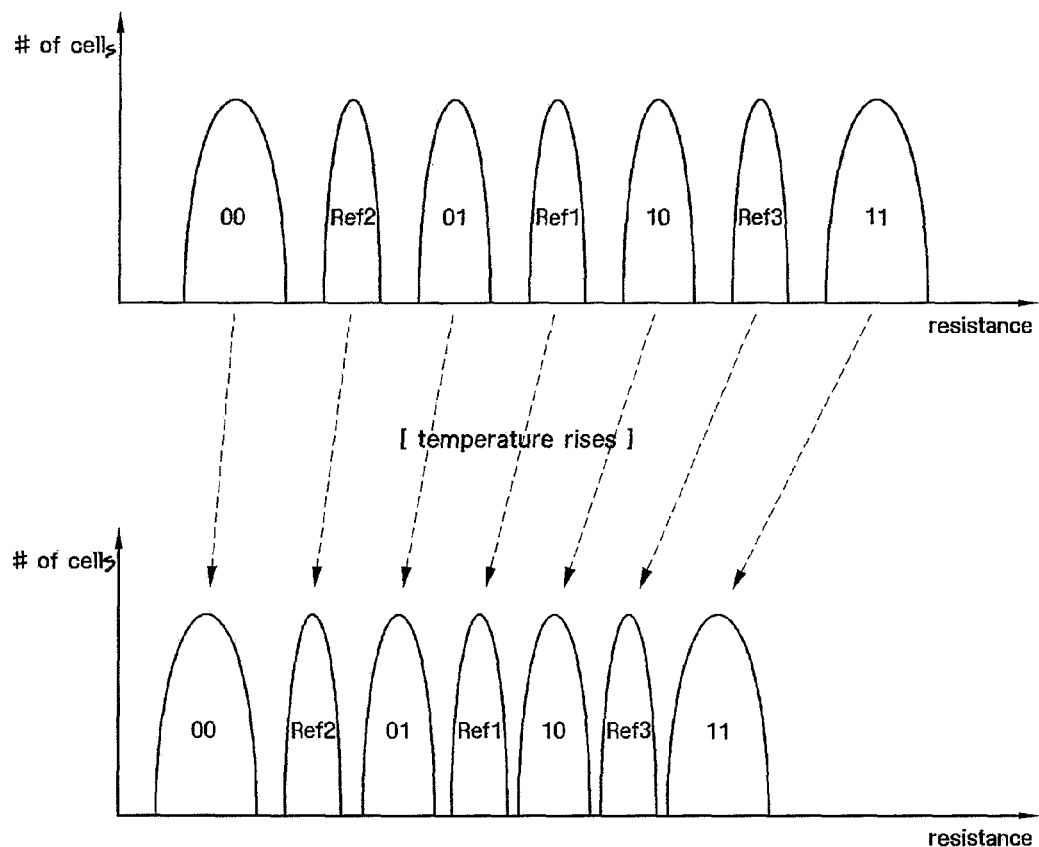

FIGS. 13A and 14 illustrate graphs diagramming set and reset resistance margins of a single level cell, i.e., a 1-bit level cell. FIGS. 13B and 15 illustrate graphs diagramming set and reset resistance margins of a multi-level cell, i.e., an n-bit (where n is a natural number equal to or more than 2, level cell.

Embodiments of a nonvolatile memory cell may have a plurality of first resistance distributions and the plurality of first resistance distributions are characterized so as to ensure a margin. That is, e.g., the plurality of resistance distributions do not overlap with one another and/or may be spaced apart from each other, i.e., no common and/or adjacent level resistance among the resistance distributions.

For example, if the nonvolatile memory cell is a single level cell, the plurality of first resistance distributions may be $2(=2^1)$ types, i.e., "SET" and "RESET," as illustrated in FIG. 13A. The nonvolatile memory cell may have a resistance corresponding to one of the plurality of first resistance distributions.

If the nonvolatile memory cell is a multi-level memory cell, the nonvolatile memory cell has one of $2^n$ different resistance distributions. For example, if the nonvolatile memory cell is a 2-bit multi-level cell, the plurality of first resistance distributions may be 4 $(=2^2)$ types, i.e., "00," "01," "10," and "11," as illustrated in FIG. 13B. The respective nonvolatile memory cell may have a resistance corresponding to one of the plurality of first resistance distributions. The resistance distributions "00," "01," "10," and "11" may be determined according to an amorphous amount of a phase change material. For example, "00" may correspond to the phase change material being crystalline, and an amorphous amount of the phase change material may increase in order of "01," "10," and "11."

The nonvolatile memory device according to the present embodiment also includes one or more reference cells for adjusting an amount of compensation current or clamping current to improve reliability of a read operation. The reference cell may be equal to the nonvolatile memory cell. In other words, the reference cell may include a variable resistive element and an access element like the nonvolatile memory cell, wherein the variable resistive circuit may be a phase change material.

The reference cell has one among one or more second resistance distributions. The second resistance distributions may not overlap with the plurality of first resistance distributions of the nonvolatile memory cell.

Referring to FIG. 13A, e.g., if the nonvolatile memory cell is a single level cell, the reference cell may have a resistance distribution "Ref1." If, e.g., the nonvolatile memory cell is a multi-level memory cell, i.e., an n-bit level cell, the reference cell may have $2^n-1$ resistance distributions. For example, if the nonvolatile memory cell is the 2-bit multi-level cell, the reference cell may have 3 $(=2^2-1)$ different resistance distributions "Ref1," "Ref2," and "Ref3," as illustrated in FIG. 13B. That is, e.g., when the nonvolatile memory cell is an m-bit (wherein m is a natural number) level cell, the reference cell has $2^m-1$ resistance distributions.

Also, as illustrated in FIGS. 13 and 13B, one of the second resistance distributions may be positioned between two adjacent ones among the plurality of first resistance distributions. For example, as illustrated in FIG. 13B, the resistance distribution "Ref2" may be positioned between the resistance distributions "00" and "01," the resistance distribution "Ref1" may be positioned between the resistance distributions "01" and "10," and the resistance distribution "Ref3" may be positioned between the resistance distributions "10" and "11."

Referring to FIG. 14, the resistance distribution of the nonvolatile memory cell and the resistance distribution of the reference cell may change as temperature rises. In other words, as temperature rises, an amount by which a resistance distribution corresponding to "RESET" decreases may be greater than an amount by which the resistance distribution corresponding to "SET" decreases. Therefore, a margin between the resistance distributions "SET" and "RESET" may gradually decrease as temperature rises.

However, in embodiments, an arrangement order of the resistance distribution "SET," the resistance distribution "Ref1" of the reference cell, and the resistance distribution "RESET" may remain constant relative to changes, e.g., increases, in temperature. Referring to FIGS. 13A and 14, the resistance distribution "SET," the resistance distribution "Ref1" of the reference cell, and the resistance distribution "RESET" do not overlap with one another. Therefore, embodiments may enable a resistance of the reference cell may be used as a criterion for accurately discriminating between a set resistance and a reset resistance.

Referring to FIG. 15, like in FIG. 14, a resistance distribution of the nonvolatile memory cell and a resistance distribution of the reference cell change as temperature rises. In other words, an amount by which a resistance distribution corresponding to "00," "01," "10," and "11" decreases may increase, respectively, as temperature rises. Therefore, margins among the resistance distributions "00," "01," "10," and "11" may decrease as temperature rises. However, in embodiments, an arrangement order of the resistance distributions "00," "01," "10," and "11" and resistance distributions "Ref1," "Ref2," and "Ref3" of the reference cell may remain the same as temperature rises. Also, the resistance distributions "00," "01," "10," and "11" and the resistance distributions "Ref1," "Ref2," and "Ref3" do not overlap with one another. Therefore, embodiments may enable resistances of the reference cell to be used as criteria for accurately discriminating resistances corresponding to resistance distributions "00," "01," "10," and "11."

In some embodiments, an amount of compensation current and/or clamping current may be controlled using a resistance of a reference cell. As described with reference to FIGS. 14 and 15, a change in the resistance of the reference cell caused by a change in the temperature may sufficiently reflect the change in the resistance of the nonvolatile memory cell caused by the change in the temperature. In other words, since the resistance of the nonvolatile memory cell changes according to the temperature, the resistance of the reference cell may change according to the temperature. Therefore, an amount of the compensation current and/or clamping current may sufficiently reflect the change in the temperature.

A change in the resistance of the reference cell may be used to more accurately control an amount of the compensation current and/or clamping current. Since the reference cell and the nonvolatile memory cell are the same type of memory cells, a change in the resistance of the reference cell may accurately reflect a change in the resistance of the nonvolatile memory cell.

A detailed structure (block or circuit) for controlling an amount of compensation current and/or clamping current using a reference cell will now be described.

Figure 16:
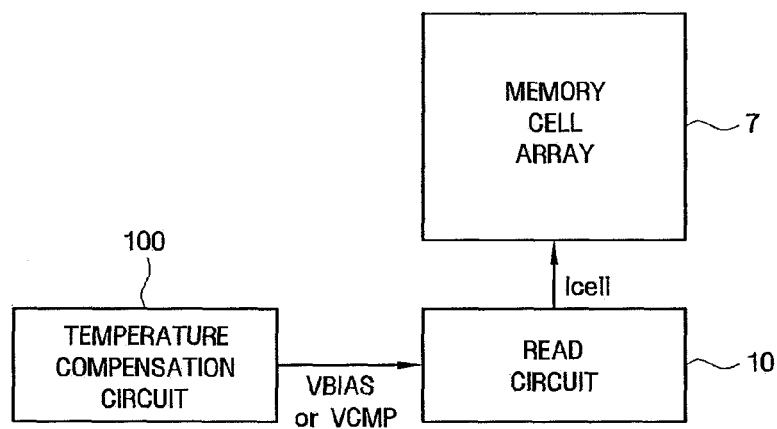
FIG. 16 illustrates a block diagram of an exemplary embodiment nonvolatile memory device.

FIG. 16 illustrates a block diagram of an exemplary nonvolatile memory device. The exemplary nonvolatile memory device of FIG. 16 may have one or more of the characteristics illustrated in FIGS. 13A, 13B, 14, and 15.

A read operation performed using a resistance of a reference cell will be described with reference to FIG. 16 based on the descriptions of FIGS. 13A, 13B, 14, and 15. Referring to FIG. 16, the nonvolatile memory device may include a memory cell array 7, a read circuit 10, and a temperature compensation circuit 100.

The read circuit 10 may have the same structure as the data read circuit 10 described with reference to FIG. 3. The compensation unit 14 may control an amount of compensation current according to the compensation control signal VBIAS that may change based on temperature. The clamping unit 16 may control an amount of clamping current, which may flow from the sensing node NS into the bit line BL, according to the clamping control signal VCMP that may change according to temperature.

The memory cell array 7 may include a plurality of nonvolatile memory cells. Each of the plurality of nonvolatile memory cells has a resistance corresponding to one of a plurality of first resistance distributions. In other words, if the nonvolatile memory cells are single level cells, the nonvolatile memory cells may have a set resistance or a reset resistance. If the nonvolatile memory cells are multi-level memory cells, each of the nonvolatile memory cells may have a resistance of, e.g., one of resistance distributions "00," "01," "10", and "11."

The temperature compensation circuit 100 may include one or more reference cells. Each of the one or more reference cells may have a resistance corresponding to one among one or more second resistance distributions. In the exemplary embodiments of FIGS. 13A and 13B, each of the reference cells has a resistance of resistance distribution "Ref1" and a resistance of one of resistance distributions "Ref1," "Ref2," and "Ref3," respectively.

The one or more reference cells may form a reference set. For example, the number of resistance distributions to which the one or more reference cells may correspond to may be equal to the number of one or more reference cells belonging to the reference set. If the nonvolatile memory cells are the single level cells, the reference cell may have one resistance level distribution "Ref1." If the nonvolatile memory cells are multi-level cells (n-bit level cells), the reference cells may have $2^n-1$ resistance level distributions. More particularly, e.g., if the nonvolatile memory cells are the single level cells, one reference cell may belong to the reference set. If the nonvolatile memory cells are multi-level cells (n-bit level cells), $2^n-1$ reference cells may belong to the reference set. For example, in embodiments including 2-bit level cells, there may be 3 ($=2^2-1$) reference cells in the reference set, as illustrated in FIG. 13B. Accordingly, if the nonvolatile memory cells are m-bit (where m is a natural number) level cells, $2^m-1$ reference cells belong to the reference set.

The $2^m-1$ reference cells belonging to the reference set may respectively have resistances corresponding to different resistance distributions. For example, if the nonvolatile memory cells are 2-bit level cells, 3 reference cells may belong to the reference set and may respectively have resistances corresponding to different resistance distributions, e.g., "Ref1," "Ref2," and "Ref3".

The temperature compensation circuit 100 may generate a compensation control signal VBIAS and/or a clamping control signal VCMP that change based on resistances of the reference cells. As described with reference to FIGS. 14 and 15, the resistances of the reference cells change with the change in the temperature. Thus, the compensation control signal VBIAS and/or the clamping control signal VCMP may also change according to temperature. An exemplary structure and an exemplary operation of the temperature compensation circuit 100 will be described in more detail later with reference to FIGS. 17 through 21.

Figure 17:
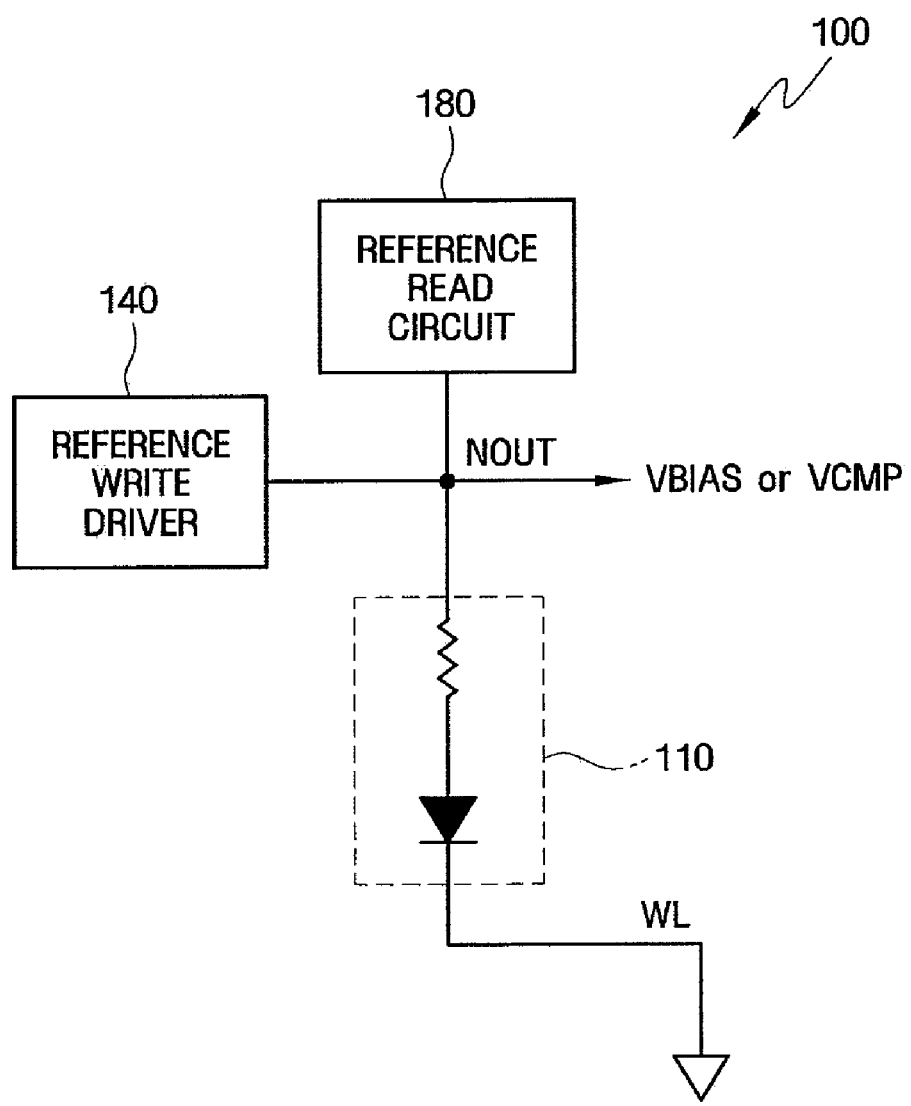
FIG. 17 illustrates a block diagram of an exemplary embodiment of the temperature compensation circuit of the nonvolatile memory device of FIG. 16.

FIG. 17 illustrates a block diagram of an exemplary embodiment of the temperature compensation circuit 100 of the nonvolatile memory device of FIG. 16.

The reference write driver 140 may be coupled to the output node NOUT and may provide write current to the reference cell 110 to determine a resistance distribution of the reference cell 110. An exemplary structure of the reference write driver 140 is described below with reference to FIG. 18.

The reference read circuit 180 may be coupled to the output node NOUT and may provide read current to the reference cell 110 in order to read the resistance distribution of the reference cell 110. In other words, the reference read circuit 180 may check whether the resistance of the reference 110 is in a target position, e.g., within a target resistance distribution. An exemplary structure of the reference read circuit 180 is described below with reference to FIGS. 19 through 21.

If the resistance distribution of the reference cell 110 is not in the target position, the reference write driver 140 may re-provide the write current to the reference cell 110 to determine a resistance distribution of the reference cell 110. If the resistance distribution of the reference cell 110 is in the target position, the reference write driver 140 may output the compensation control signal VBIAS and/or the clamping control signal VCMP having a respective value based on a resistance level of the reference cell 100, through the output node NOUT.

The reference write driver 140 may be a replica circuit of a write driver supplying write current to a nonvolatile memory cell to determine a resistance distribution of the nonvolatile memory cell. The reference read circuit 180 may be a replica circuit of a read circuit (refer, e.g., to FIG. 3) supplying read current to a nonvolatile memory cell to read a resistance distribution of the nonvolatile memory cell. As described above, since the reference cell 110 may correspond to a nonvolatile memory cell, a change in the resistance of the reference cell 110 caused by a change in a temperature may correspond to, e.g., may sufficiently reflect, a change in a resistance of the nonvolatile memory cell caused by the change in the temperature. More particularly, if the reference write driver 140 and the reference read circuit 180 are replica circuits of the write driver and the read driver, respectively, a change in the resistance of the reference cell 110 caused by a change in the temperature may further accurately reflect, e.g., be the same and/or substantially the same as, a change in the resistance of the nonvolatile memory cell caused by a change in the temperature. However, embodiments of the reference write driver 140 and the reference read circuit 180 are not limited to the replica circuits.

Figure 18:
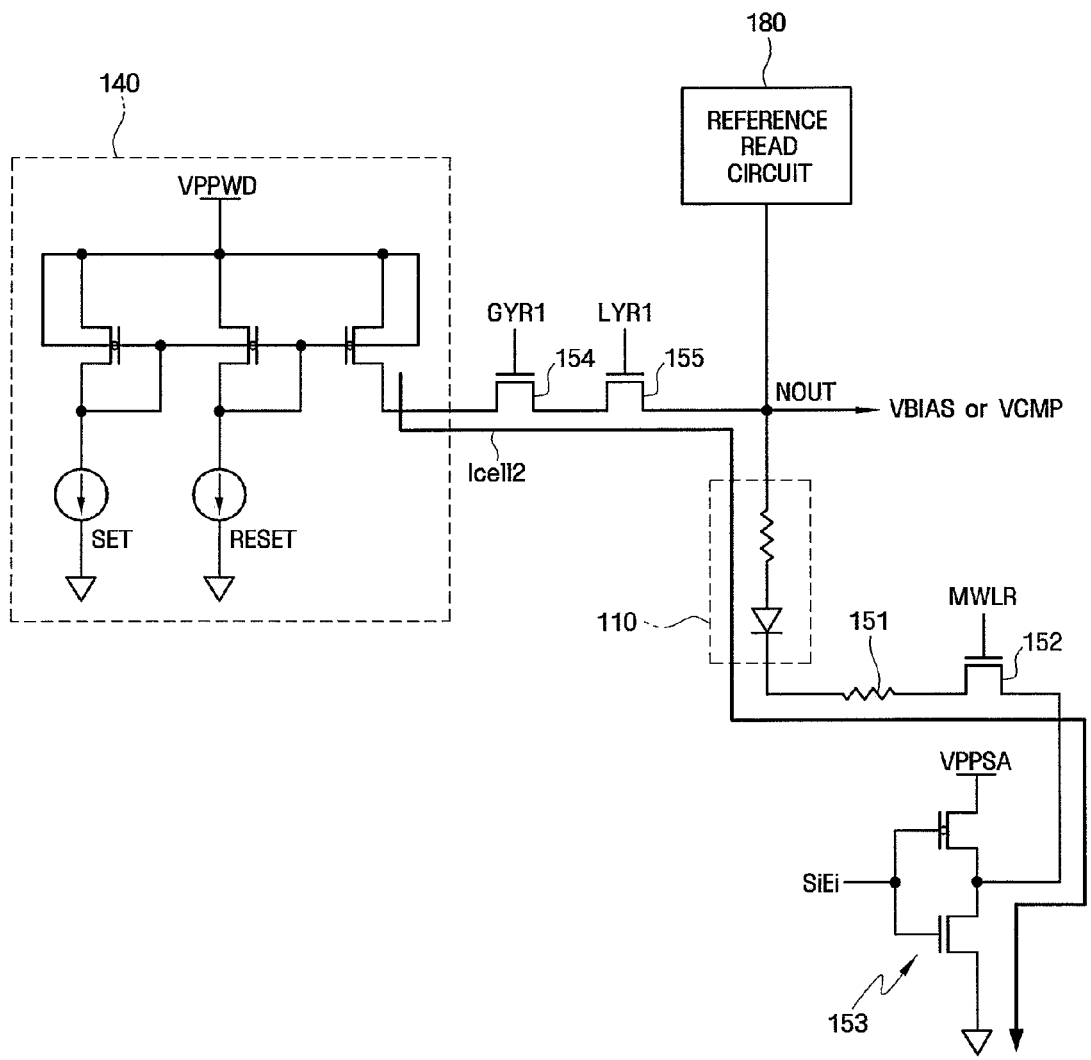
FIG. 18 illustrates a circuit diagram of portions of the nonvolatile memory device of FIG. 17, particularly portions thereof associated with a reference write operation.

FIG. 18 illustrates a circuit diagram of portions of the nonvolatile memory device of FIG. 17, particularly portions thereof associated with a reference write operation.

Referring to FIG. 18, the reference write driver 140 provides write current Icell2 for writing set data or reset data.

As illustrated in FIG. 18, the write current Icell2 may be output as a ground voltage through a first transistor 154, a second transistor 155, the reference cell 110, a first resistor 151, a third transistor 152, and an inverter 153.

Referring to FIG. 18, a global column selection replica signal GYR1 may be applied to the first transistor 154, a local column selection replica signal LYR1 may be applied to the second transistor 155, and a main word line replica signal MWLR may be applied to the third transistor 152. In other words, the first transistor 154 may be a replica of a global column selection circuit, the second transistor 155 may be a replica of a local column selection circuit, and the third transistor 152 may be a replica of a main word line selection circuit. The first resistor 151 may be a replica of a resistor in an active area of a substrate. The first transistor 154, the second transistor 155, the first resistor 151, the third transistor 152, and the inverter 153 may be formed in the above-described manner to reproduce a path of the write current Icell2 for executing a write operation with respect to the reference cell 110 so that the path of the write current Icell2 is equal and/or substantially equal to a path of write current for executing a write operation to a nonvolatile memory cell.

Figure 19:
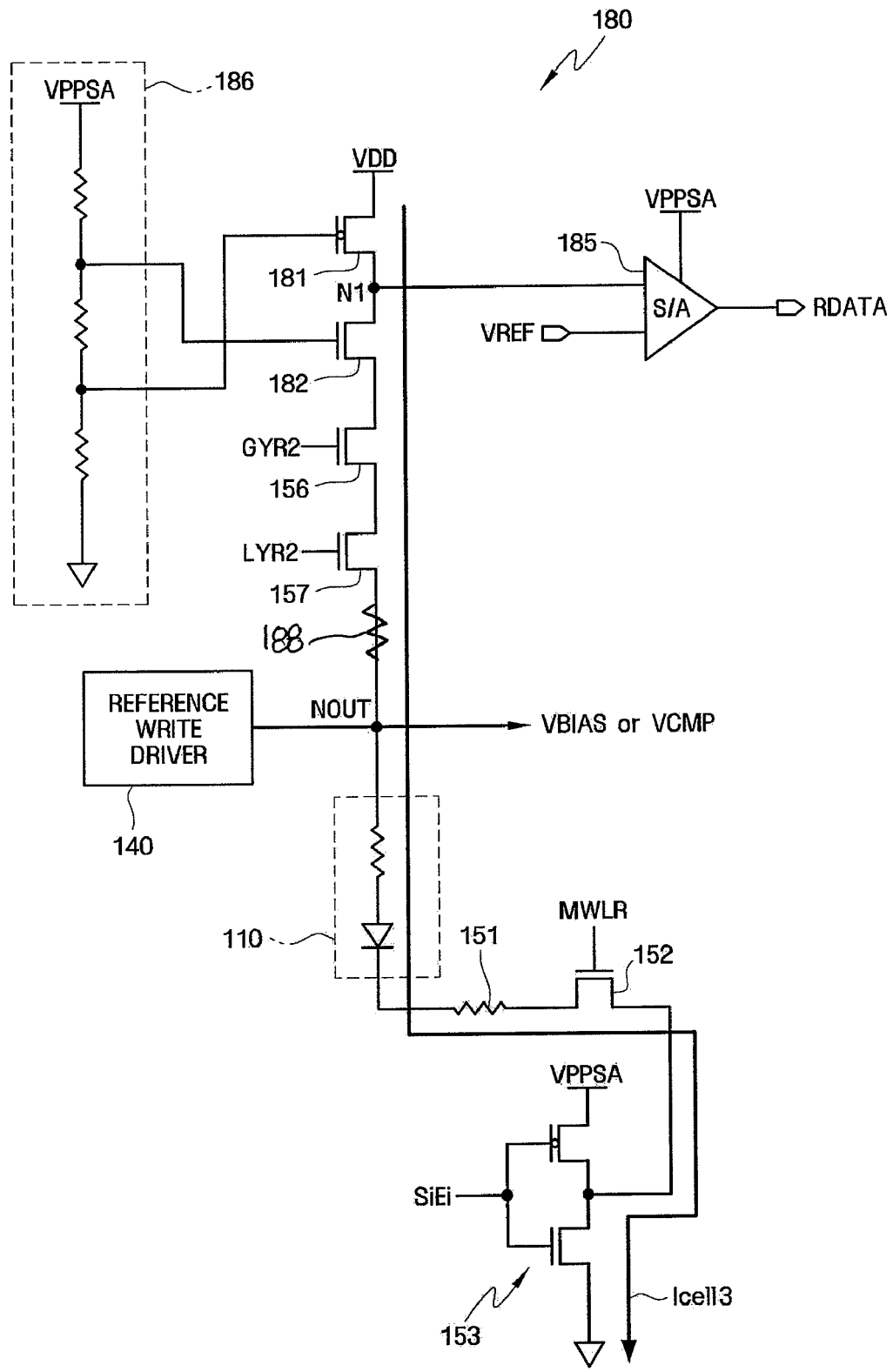
FIG. 19 illustrates an exemplary circuit diagram of portions of the nonvolatile memory device of FIG. 17, particularly portions thereof associated with a reference read operation.

FIG. 19 illustrates an exemplary circuit diagram of portions of the nonvolatile memory device of FIG. 17, particularly portions thereof associated with a reference read operation.

Referring to FIG. 19, the reference read circuit 180 may include a fourth transistor 181, a fifth transistor 182, a sense amplifier 185, a resistor array 186, and a second resistor 188.

The fourth and fifth transistors 181 and 182 may be coupled to each other in series between a boosting voltage VPPSA and an output node NOUT. The resistor array 186 may be coupled in series between the boosting voltage VPPSA and a ground voltage and may provide first and second voltages. The first voltage may be applied to a gate of the fourth transistor 181, and a second voltage may be applied to a gate of the fifth transistor 182. The fourth transistor 181 may be a replica of the compensation unit 14 shown in FIG. 3. The fifth transistor 182 may be a replica of the clamping unit 16 shown in FIG. 3. The second resistor 188 may be a replica of a bit line but is not limited thereto.

As illustrated in FIG. 19, read current Icell3 may be output as a ground voltage from the boosting voltage VPPSA through the fourth transistor 181, the fifth transistor 182, a sixth transistor 156, a seventh transistor 157, the second resistor 188, the reference cell 110, the first resistor 151, the third transistor 152, and the inverter 153.

A global column selection replica signal GYR2 may be applied to the sixth transistor 156, and a local column selection replica signal LYR2 may be applied to the seventh transistor 157. In other words, the sixth transistor 156 may be a replica of a global column selection circuit, and the seventh transistor 157 may be a replica of a local column selection circuit. The fourth transistor 181, the fifth transistor 182, the sixth transistor 156, the seventh transistor 157, the first resistor 151, the third transistor 152, and the inverter 153 may be formed in the above-described manner to reproduce a path of the read current Icell3 for executing a read operation with respect to the reference cell 110 so that the path of the reference current Icell 3 may be equal to and/or substantially equal to a path of read current for executing a read operation with respect to a nonvolatile memory cell.

The sense amplifier 185 may compare a voltage of a node N1 with a reference voltage VREF and may output reference data RDATA. The sense amplifier 185 may read the reference data RDATA to determine whether a resistance of the reference cell 110 is a desired value. If the resistance of the reference cell 110 is not the desired value, the write operation may be re-executed. If the resistance of the reference cell 110 is the desired value, a compensation control signal VBIAS and/or a clamping control signal VCMP may be output through an output node NOUT. For example, a voltage of the output node NOUT may be output as the compensation control signal VBIAS or the clamping control signal VCMP.

Alternatively, as will be described with reference to FIG. 21, the voltage of the output node NOUT may be controlled through trimming and then output as the compensation control signal VBIAS and/or the clamping control signal VCMP.

A resistance of the second resistor 188 may be controlled to control a voltage output to the output node NOUT. This is because the voltage output to the output node NOUT may be a voltage distributed by resistances of the second resistor 188 and the reference cell 110. Here, the fourth, fifth, sixth, and seventh transistors 181, 182, 156, and 157, and the third transistor 152 may have considerably low resistances. Therefore, the resistance of the reference cell 110 may be determined through the write operation. Thus, the second resistor 188 may be controlled to easily control the voltage output to the output node NOUT in a manufacturing step.

Figure 20:
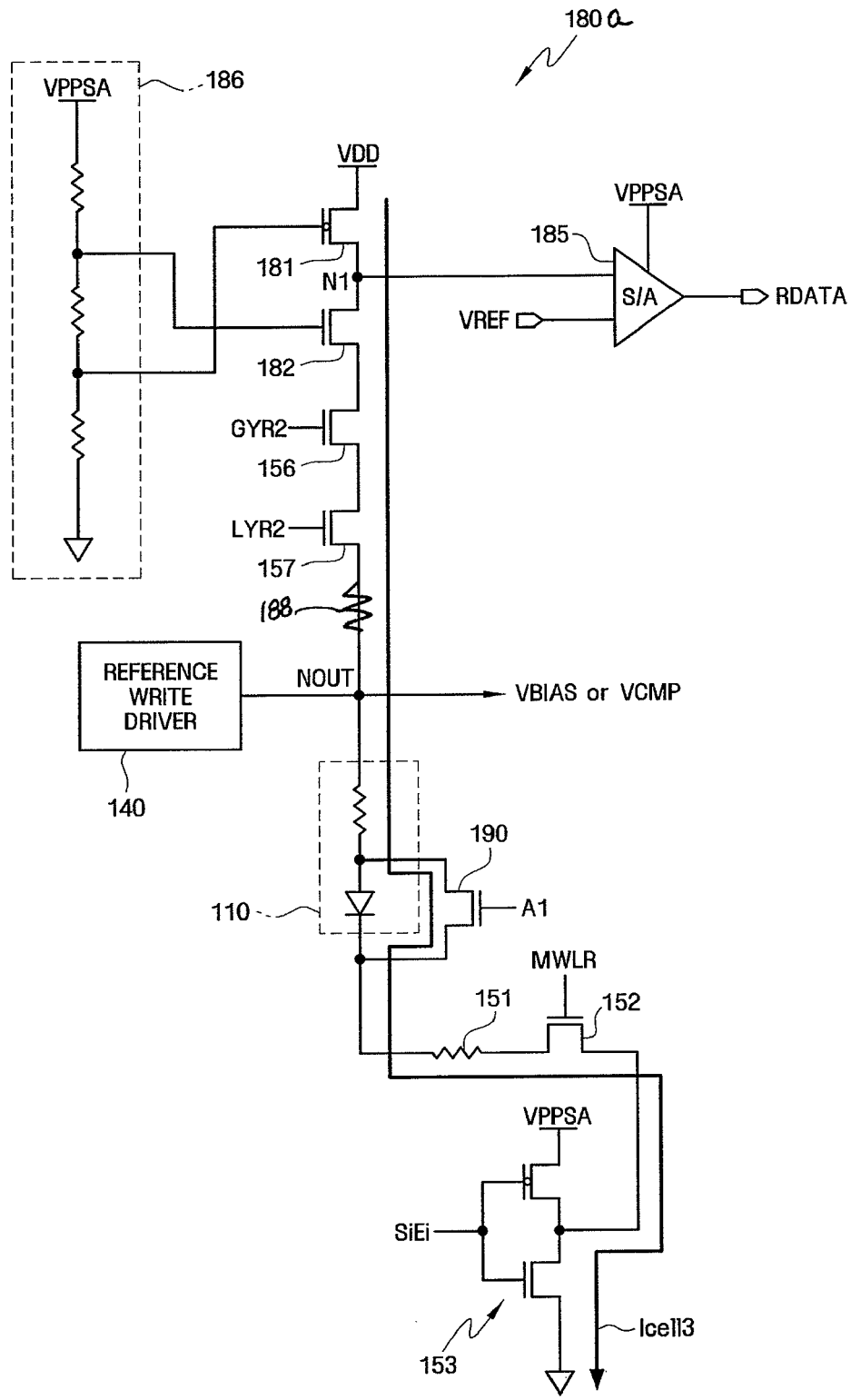
FIG. 20 illustrates another exemplary circuit diagram of portions of the nonvolatile memory device of FIG. 17, particularly portions thereof associated with a reference read operation.

FIG. 20 illustrates another exemplary circuit diagram of portions of the nonvolatile memory device of FIG. 17, particularly portions associated with a read operation.

Referring to FIG. 20, a reference read circuit 180a shown in FIG. 20 substantially corresponds to the reference read circuit 180 of FIG. 19, but further includes a bypass circuit 190. When the reference read circuit 180a executes a read operation with respect to the reference cell 110, the bypass circuit 190 is turned on in response to a control signal A1. Thus, read current Icell3 may pass a variable resistive element but bypass an access element (i.e., a diode).

If the read operation is executed with respect to the reference cell 110, and a resistance of the reference cell 110 is not a desired value, the program is to be re-executed. Therefore, an overall speed may be increased by reducing a read time as much as possible. Embodiments of the reference read circuit 180a may include the bypass circuit 190 to reduce a time taken by the read current Icell3 to pass an n-type semiconductor of the diode, thereby reducing a total read time. When a write operation is executed with respect to the reference cell 110, the bypass circuit 190 is turned off to induce current to flow toward the access element (diode).

Figure 21:
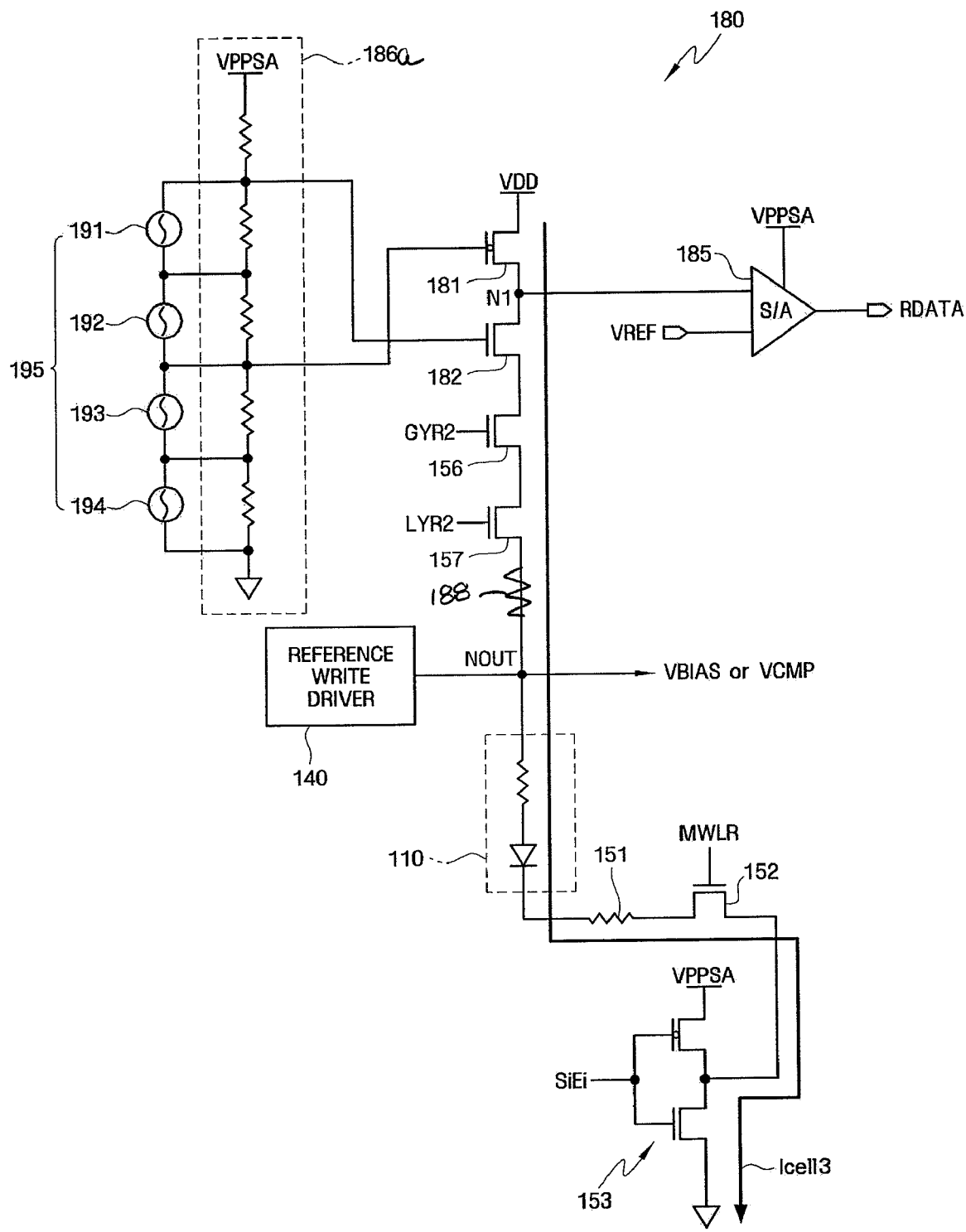
FIG. 21 illustrates another exemplary circuit diagram of portions of the nonvolatile memory device of FIG. 17, particularly portions thereof associated with a read operation.

FIG. 21 illustrates another exemplary circuit diagram of portions of the nonvolatile memory device of FIG. 17, particularly portions associated with a read operation.

Referring to FIG. 21, a reference read circuit 180b shown in FIG. 21 substantially corresponds to the reference read circuit 180 of FIG. 19, but further includes a trimming circuit 195. More particularly, a resistor array 186a may include the trimming circuit 195. The trimming circuit 195 may include a plurality of fuses 191, 192, 193, and 194.

For example, amplitudes of voltages applied to the fourth and fifth transistors 181 and 182 may be adjusted by cutting off at least one of the plurality of fuse 191 through 194 using a mode register set (MRS).

A voltage value of a compensation control signal VBIAS or a clamping control signal VCMP output through an output node NOUT may be controlled using the trimming circuit 195. In other words, even if the resistance of the reference cell 110 is a desired value, the trimming circuit 195 may be used to more fine-tunely control a voltage value of the compensation control signal VBIAS and/or the clamping control signal VCMP.

Figure 22:
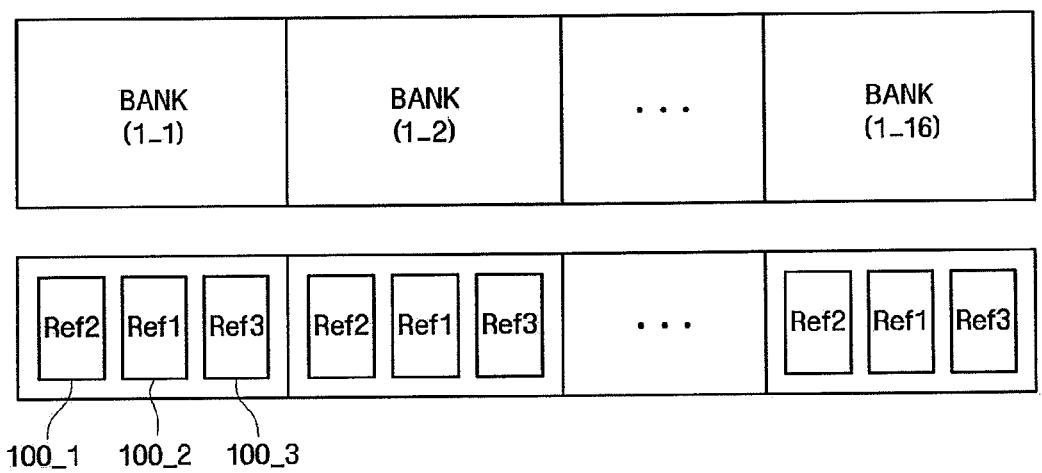
FIG. 22 illustrates is a block diagram of a nonvolatile memory device according to another exemplary embodiment.

FIG. 22 illustrates a block diagram of a nonvolatile memory device according to another exemplary embodiment.

Referring to FIG. 22, the circuit shown in FIG. 22 is different from that shown in FIG. 16 in that reference sets are explicitly arranged at each of a plurality memory banks 1_1 through 1_16. As described above, if a nonvolatile memory cell is a 2-bit level cell, the reference set may include $3(=2^2-1)$ reference cells, and each of reference cells may store resistance values corresponding to resistance distributions "Ref1," "Ref2," "Ref3." In the exemplary embodiment of FIG. 22, three temperature compensation circuits 100_1, 100_2, and 100_3 are arranged at each of the plurality of memory banks 1_1 through 1_16. Each of the temperature compensation circuits 100_1, 100_2, and 100_3 may include one corresponding reference cell among the three reference cells.

Figure 23:
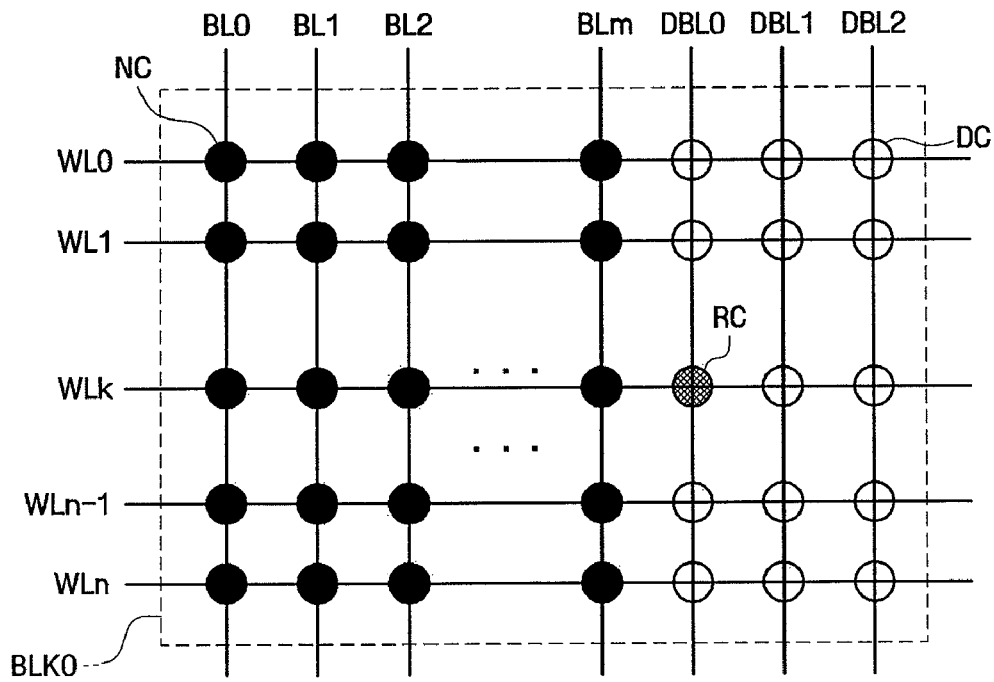
FIG. 23 illustrates a schematic diagram of an exemplary arrangement of normal cells, dummy cells and a reference cell in a portion of a nonvolatile memory device according to an exemplary embodiment.
Figure 24:
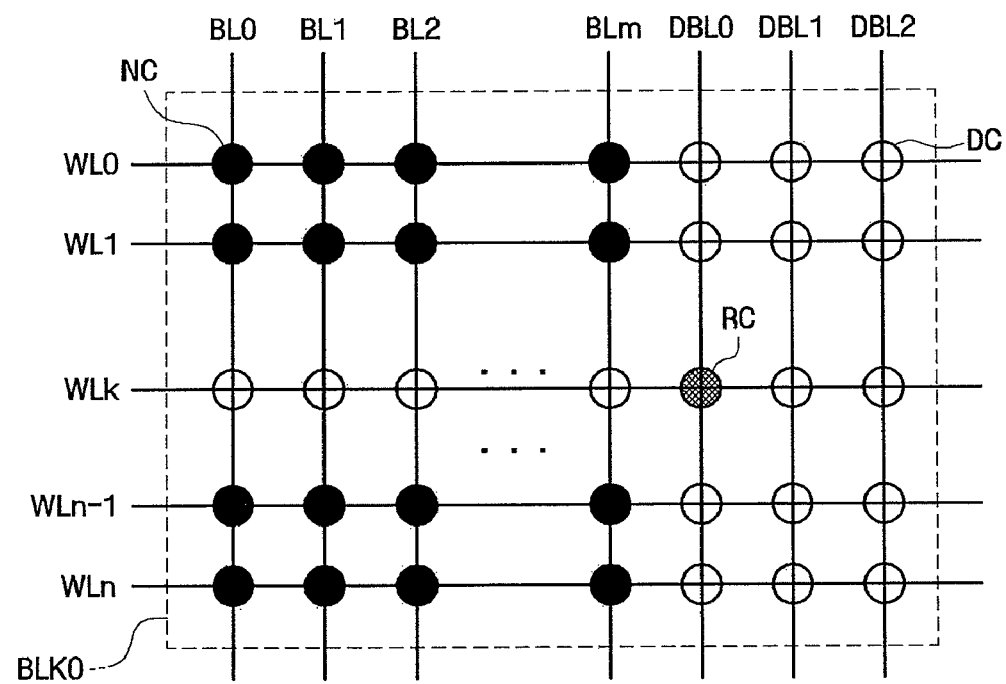
FIG. 24 illustrates a schematic diagram of an exemplary arrangement of normal cells, dummy cells and a reference cell in a portion of a nonvolatile memory device according to another exemplary embodiment.

FIGS. 23 and 24 illustrate schematic diagrams of exemplary arrangements of normal cells, dummy cells and reference cells in portions of nonvolatile memory devices according to exemplary embodiments. More particularly, the memory block BLK0 of FIG. 1 is illustrated as an exemplary memory block in FIGS. 23 and 24, and the aforementioned reference cell RC is positioned in the memory block BLK0.

Referring to FIG. 23, normal memory cells NC are connected between word lines WL0 through WLn and bit lines BL0 through Blm. Dummy memory cells DC are connected between dummy bit lines DBL0 through DBL2 and the word lines WL0 through WLn. A reference cell RC may be connected between the dummy bit line DBL0 and the word line WLk.

Here, the normal memory cells NC refer to cells storing data, and the dummy memory cells DC refer to memory cells having the same characteristics, e.g., shape, as the normal memory cells NC but are not employed to store data. As described above, the reference cell RC is a cell reflecting a change in a temperature in order to control an amount of compensation current and/or clamping current.

The reference cell RC, as illustrated in FIG. 23, may be positioned around a center of the dummy bit line DBL0 to prevent edge loading.

Referring to FIG. 24, normal memory cells NC may not be connected to a word line WLk to which a reference cell RC is connected. In other words, dummy memory cells DC and the reference cell RC may be connected to the word line WLk.

Whenever the data stored in the normal memory cells NC in the memory block BLK0 is read, the reference cell RC may also be read. The word line WLk connected to the reference cell RC may be connected to a ground voltage. If the normal memory cells NC are connected to the word line WLk, the normal memory cells NC may be adversely affected. Thus, the normal memory cells NC may not be connected to the word line WLk to which the reference cell RC is connected.

Figure 25:
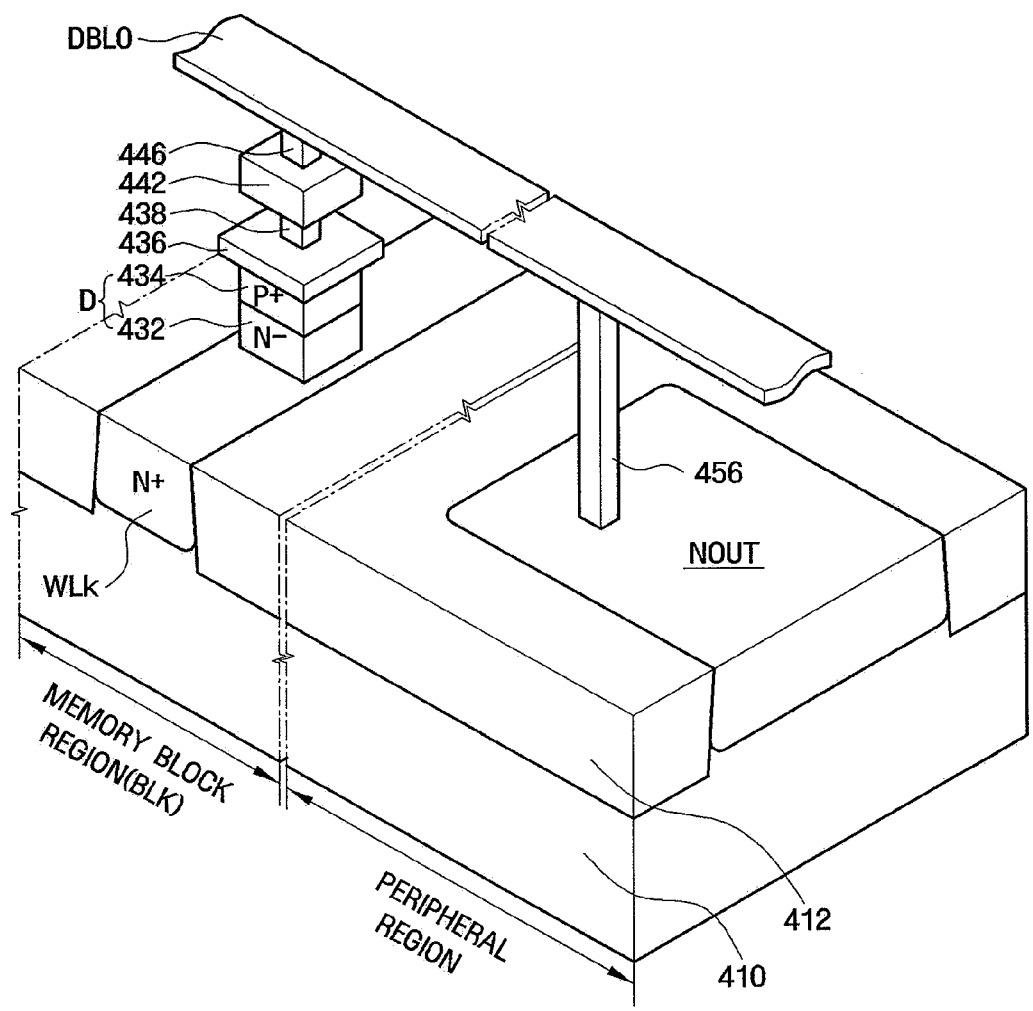
FIG. 25 illustrates a perspective view illustrating a nonvolatile memory device according to another exemplary embodiment.
Figure 26:
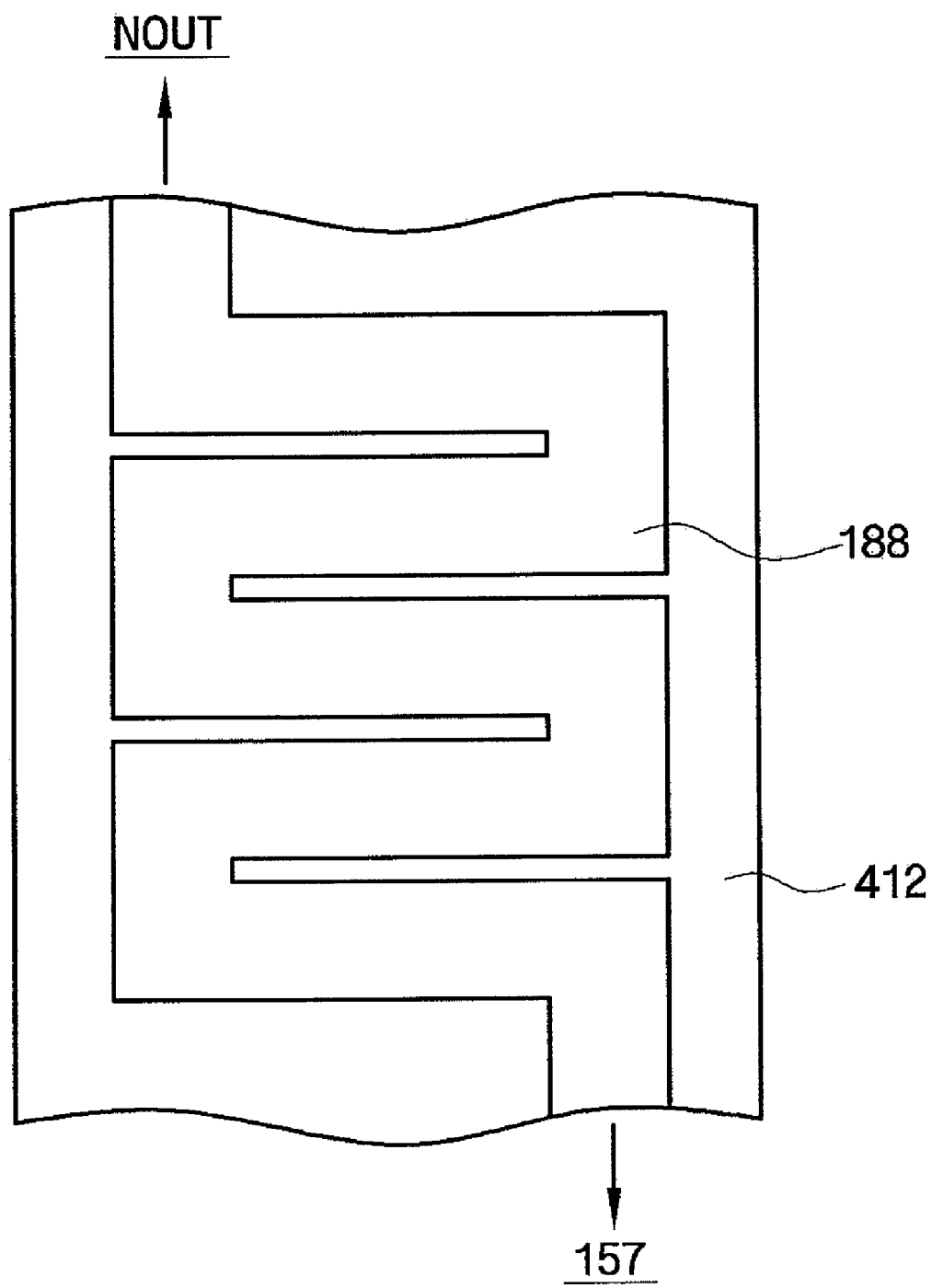
FIG. 26 illustrates a layout illustrating an exemplary second resistor implemented in the nonvolatile memory device shown in FIG. 25.

FIG. 25 illustrates a perspective view of a nonvolatile memory device according to another exemplary embodiment. FIG. 26 illustrates a layout diagram of an exemplary second resistor implemented in the nonvolatile memory device shown in FIG. 25.

Referring to FIG. 25, when the reference cell RC is arranged in the memory block BLK0, as described above with reference to FIGS. 23 and 24, the reference write driver 140 and the reference read circuit 180 may be arranged in a peripheral region (refer to FIG. 1).

Referring to FIG. 25, an isolation region may be formed in a first conductivity type (e.g., a P-type) substrate 410 to define a plurality of active regions. For example, the active regions formed in the memory block BLK0 may extend in a first direction. Second conductivity type (e.g., an N-type) dopant may be implanted into the active regions formed in the memory block BLK0 to form a word line WLk. The substrate 410 may be a silicon substrate, an SOI (Silicon-On-Insulator) substrate, a gallium arsenic (GaAs) substrate, a silicon germanium substrate, or the like. Although the exemplary embodiment illustrates that the word line WLk is formed by implanting the second conductivity type dopant, aspects are not limited thereto. For example, the word line WLk may be formed by epitaxial growth performed on the substrate 410.

First and second semiconductor patterns 432 and 434 may be formed on the word line WLk to form a diode D. For example, the first and second semiconductor patterns 432 and 434 may be formed such that a mold pattern is formed on the substrate 410, semiconductor patterns are formed along the mold pattern using a selective epitaxial growth or a solid phase epitaxial (SPE) growth, and an ion injection process is then performed.

Subsequently, an ohmic contact layer 436 may be formed on the diode D. The ohmic contact layer 436 may be formed using a metal, e.g., tungsten. The ohmic contact layer 436 may be formed by physical vapor deposition (PVD), chemical vapor deposition (CVD), atomic layer deposition (ALD), or the like.

A lower electrode contact 438 may be formed on the ohmic contact layer 436. The lower electrode contact 438 may be formed of, e.g., TiN, TiAlN, TaN, WN, MoN, NbN, TiSiN, TiBN, ZrSiN, WSiN, WBN, ZrAlN, MoSiN, MoAlN, TaSiN, TaAlN, TiW, TiAl, TiON, TiAlON, WON, TaON, or the like, but aspects are not limited thereto.

A phase change material 442 may be formed on the lower electrode contact 438. A top electrode contact (TEC) 446 may be formed on the phase change material 442. The TEC 446 may be omitted. A dummy bit line DBL0 may be formed on the TEC 446 and may extend in first and second directions. In other words, the word line WLk may be disposed to intersect with the dummy bit line DBL0. The dummy bit line DBL0 may extend to the peripheral region. The dummy bit line DBL0 may include aluminum (Al) or copper (Cu), for example, may be a metal wire having a lowest level.

Here, a specific active region (a region corresponding to an output node NOUT) of the peripheral region and the dummy bit line DBL0 may be connected to each other through a contact 456. A plurality of contacts may be vertically stacked to form the contact 456.

Referring to FIG. 26, the second resistor 188 may be realized using various methods, e.g., may be implemented by forming active regions in a zigzag form in the substrate 410. In other words, the second resistor 188 may be implemented in an active region positioned between a region in which the output node NOUT is realized and a region in which a seventh transistor 157 is to be formed. If the active regions are repeated a plurality of times, a physical length of the active regions may increase. Thus, a size of the second resistor 188 may be easily adjusted.

Figure 27:
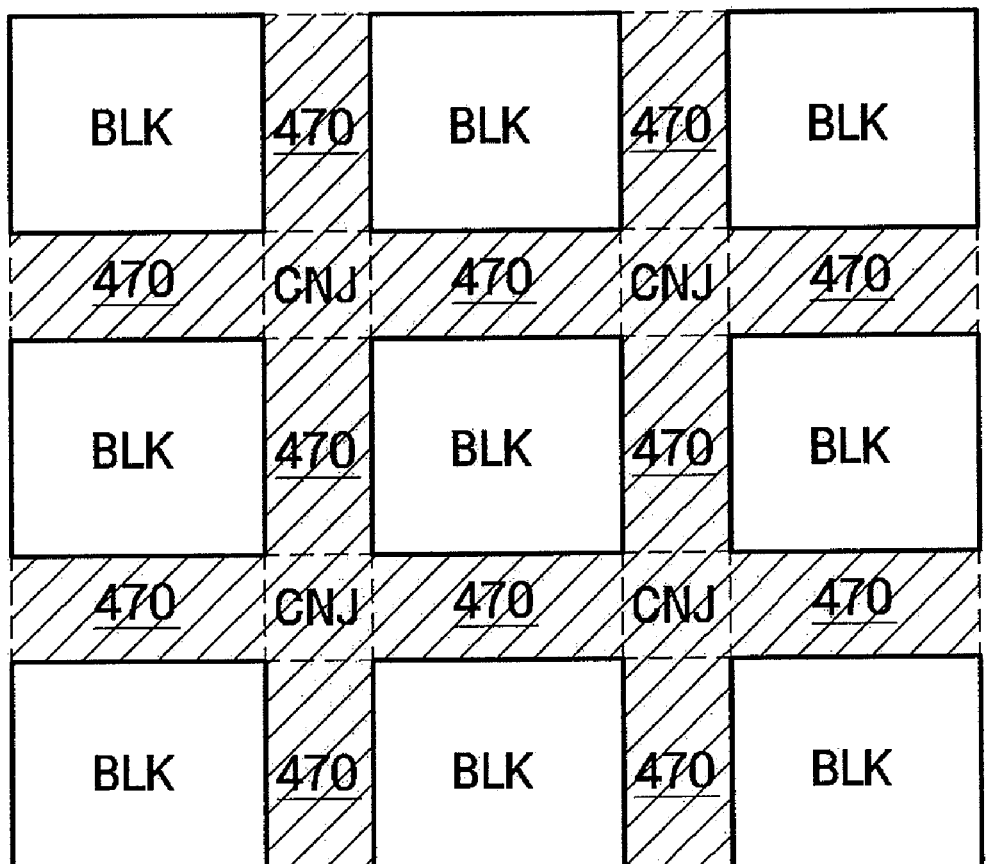
FIG. 27 layout diagram of a nonvolatile memory device according to another example embodiment.
Figure 28:
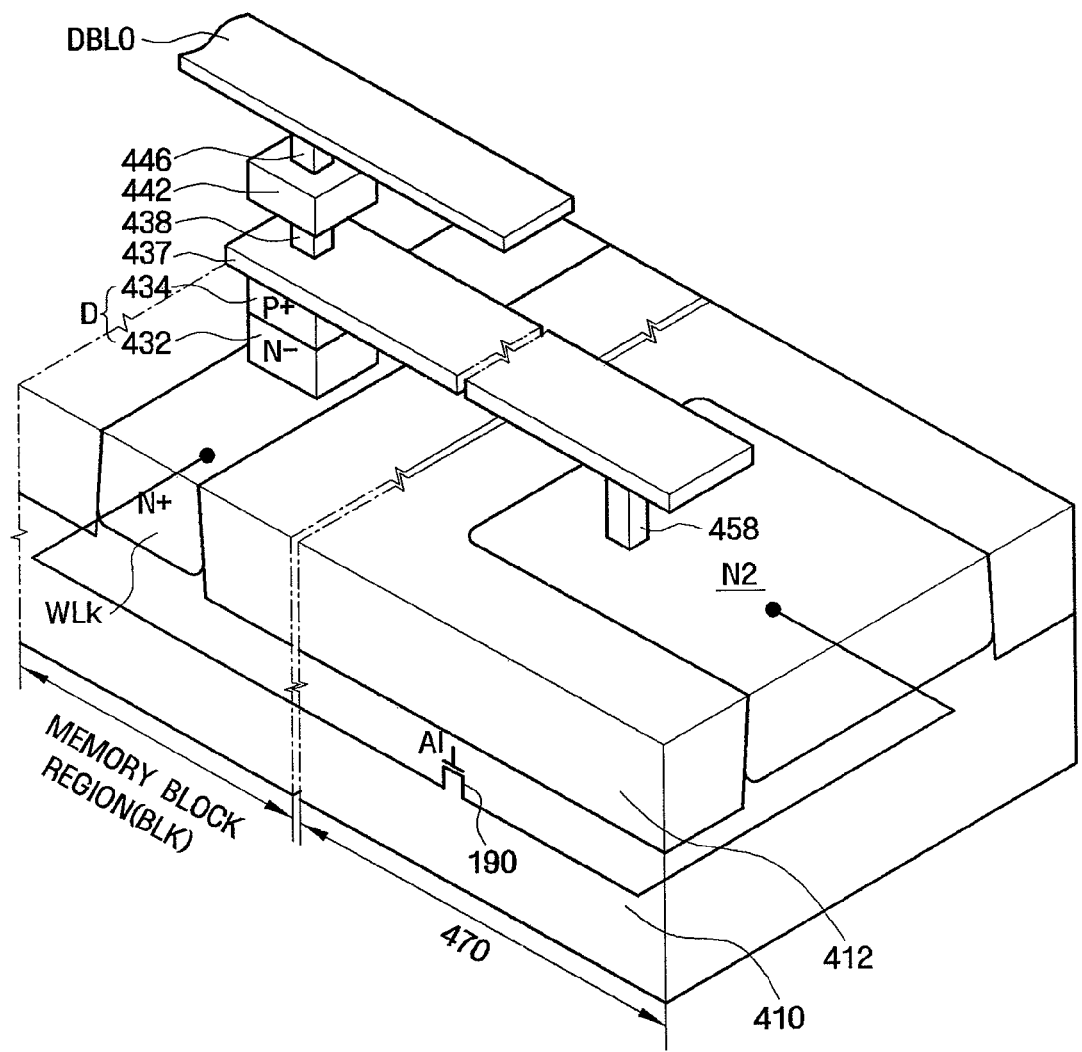
FIG. 28 illustrates a perspective view of the nonvolatile memory device shown in FIG. 27.

FIG. 27 illustrates a layout diagram of a nonvolatile memory device according to another example embodiment. FIG. 28 illustrates a perspective view of the nonvolatile memory device shown in FIG. 27, and, substantially corresponds to the exemplary nonvolatile memory device of FIG. 15, but further including the bypass circuit 190. More particularly, FIGS. 27 and 28 illustrate examples of implementing the circuit shown in FIG. 20, i.e., a circuit further including the bypass circuit 190.

Referring to FIG. 27, a plurality of memory blocks BLK may be arranged in a 3×3 matrix. Regions 470 in which local column selection circuits and the like may be arranged may be disposed between each of the plurality of memory blocks BLK, and conjunction regions CNJ may be disposed between adjacent ones among the regions 470. In such embodiments, reference cells may be positioned in the memory blocks BLK, and the bypass circuits 190 may be disposed in the regions 470 in which the local column selection circuits, etc., are arranged.

FIG. 28 illustrates the bypass circuit 190 implemented in the region 470. Referring to FIG. 28, an ohmic contact layer 437 may be connected to a reference cell RC and may extend from the memory block BLK to the region 470. The ohmic contact layer 437 may be connected to a node N2 through a contact 458, in which the node N2 is implemented in an active region defined in the region 470. The bypass circuit 190 may be formed in the region 470 and may be connected between the node N2 and a word line WLk.

Figure 29:
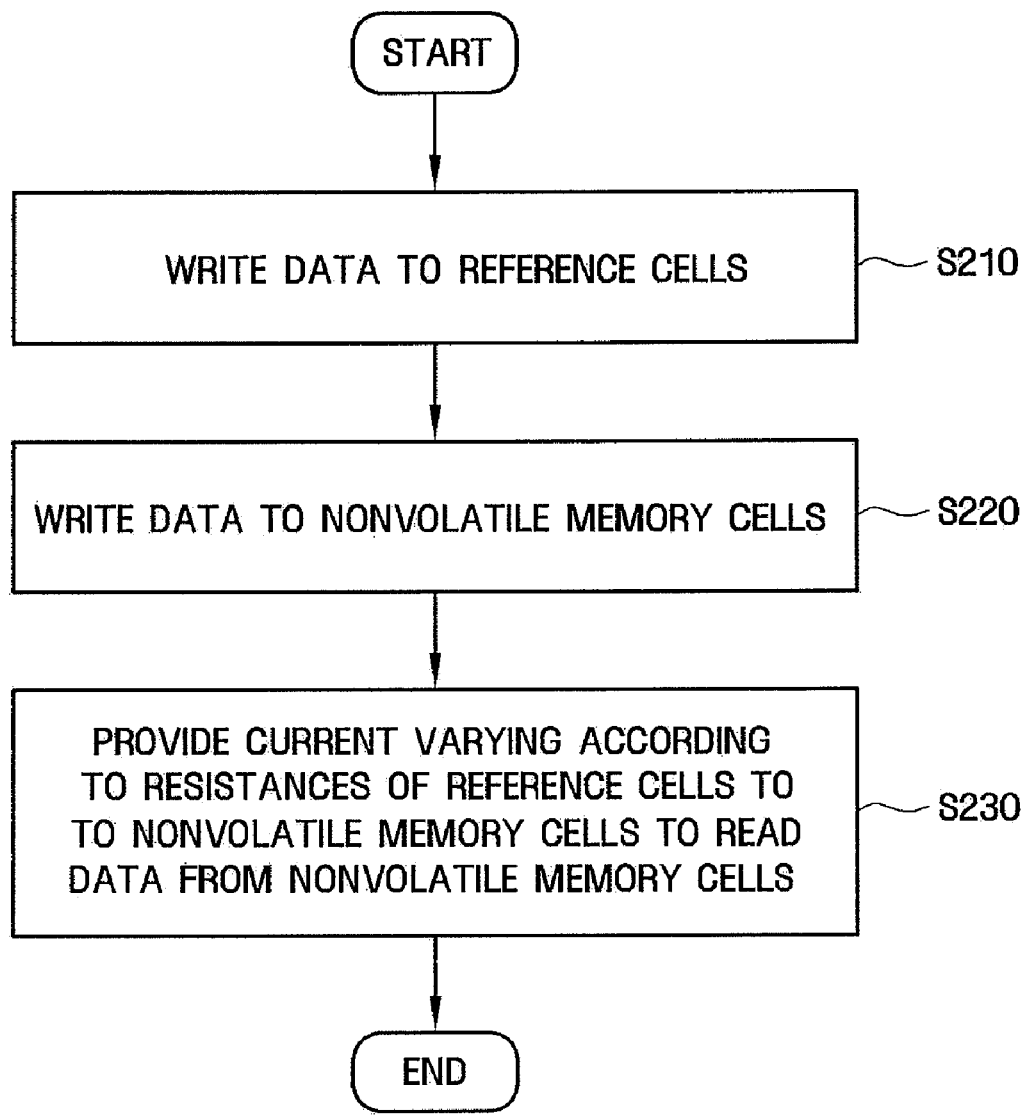
FIG. 29 illustrates a flowchart of an exemplary method of driving the nonvolatile memory devices shown in FIGS. 16 and 22.

FIG. 29 illustrates a flowchart of an exemplary method of driving the nonvolatile memory devices shown in FIGS. 16 and 22.

Referring to FIGS. 16 and 29, a memory cell array including m-bit (wherein m is a natural number) level cells and a reference set including $2^m-1$ reference cells are provided. During S210, data may be written to the $2^m-1$ reference cells belonging to the reference set so that the $2^m-1$ reference cells respectively have different resistance distributions. For example, if the m-bit level cells are 2-bit level cells, $3(=2^2-1)$ reference cells may belong to the reference set and may store resistance values corresponding to resistance distributions "Ref1," "Ref2," and "Ref3." During S220, data may be written to the m-bit level cells. During S230, current varying according to resistances of the $2^m-1$ reference cells may be supplied to the m-bit level cells to read the data from the m-bit level cells. For example, compensation current varying according to resistance values sequentially corresponding to resistance distributions "Ref1," "Ref2," and "Ref3" may be supplied to the m-bit level cells to read data from the m-bit level cells.

FIGS. 30, 31, 32, 33, and 34 illustrate diagrams of storage systems using a nonvolatile memory device according to exemplary embodiments.

Figure 30:
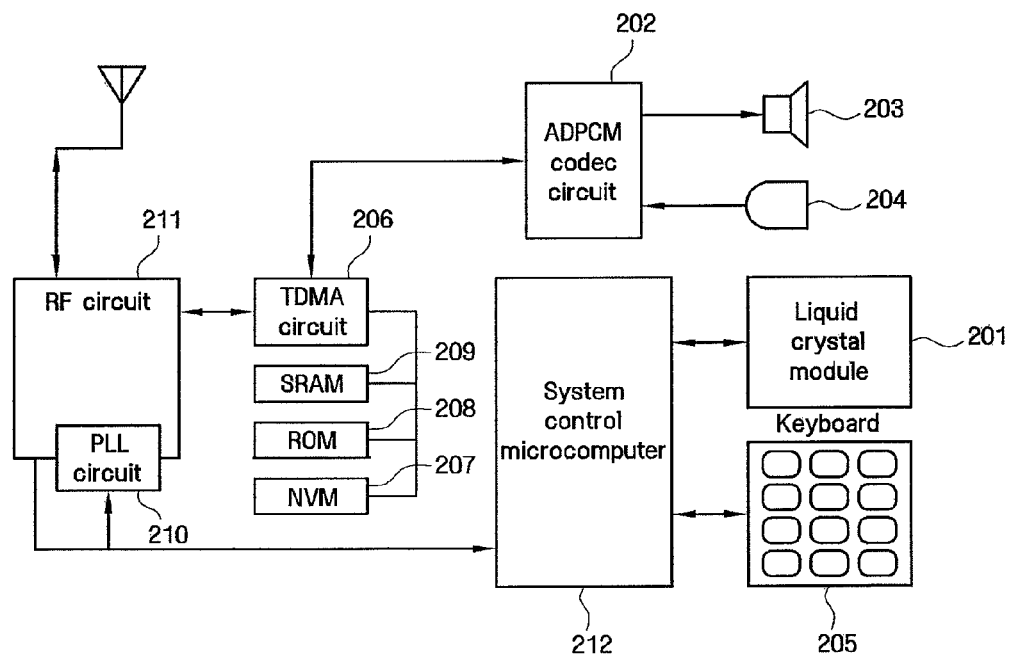
FIG. 30 illustrates a block diagram of an exemplary cellular phone system employing nonvolatile memory devices according to embodiments.

More particularly, FIG. 30 illustrates a block diagram of an exemplary cellular phone system using nonvolatile memory devices according to embodiments. Referring to FIG. 30, the cellular phone system may include an adaptive differential pulse-code modulation (ADPCM) codec circuit 202, a speaker 203, a microphone 204, a time division multiple access (TDMA) circuit 206, a phase-locked loop (PLL) circuit 210, a radio frequency (RF) circuit 211, and the like. The ADPCM codec circuit 202 may compress or decompress sound, the TDMA circuit 206 time-division-multiplexes digital data, the PLL circuit 210 sets a carrier frequency of an RF signal, and the RF circuit 211 transmits or receives the RF signal.

The cellular phone system may include one or more types of memory devices, e.g., a nonvolatile memory (NVM) 207, a read only memory (ROM) 208, and a static random access memory (SRAM) 209. The nonvolatile memory devices according to exemplary embodiments may be used as the nonvolatile memory 207, and may store, for example, ID numbers. The ROM 208 may store a program. The SRAM 209 may serve as a working area for a system control microcomputer 212 or may temporarily store data. The system control microcomputer 212 is a processor, which may control write and read operations of the NVM 207.

Figure 31:
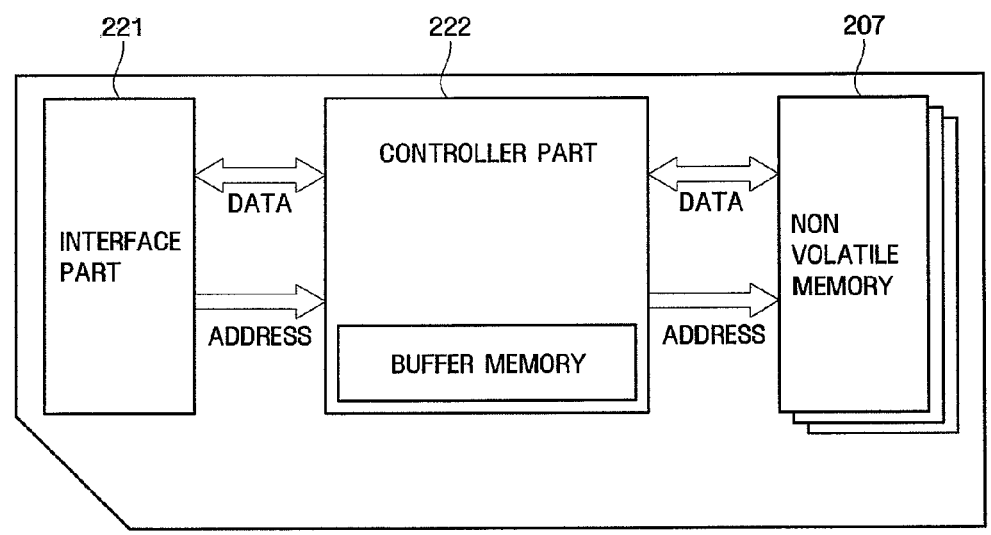
FIG. 31 illustrates a block diagram of an exemplary memory card employing a nonvolatile memory device according to embodiments.

FIG. 31 illustrates a block diagram of an exemplary memory card employing a nonvolatile memory device according to embodiments. Examples of the memory card may include an MMC card, an SD card, a multiuse card, a micro SD card, a memory stick, a compact SD card, an ID card, a PCMCIA card, an SSD card, a chip card, a smart card, a USB card, and so on. Referring to FIG. 31, the memory card may include an interface part 221 interfacing with an external device, a controller part 222 including a buffer memory and controls an operation of the memory card, and at least one nonvolatile memory 207 according to exemplary embodiments. The controller part 222 may be a processor and may control write and read operations of the nonvolatile memory 207. In detail, the controller part 222 may be coupled to the nonvolatile memory 207 and the interface part 221 through a data bus DATA and an address bus ADDRESS.

Figure 32:
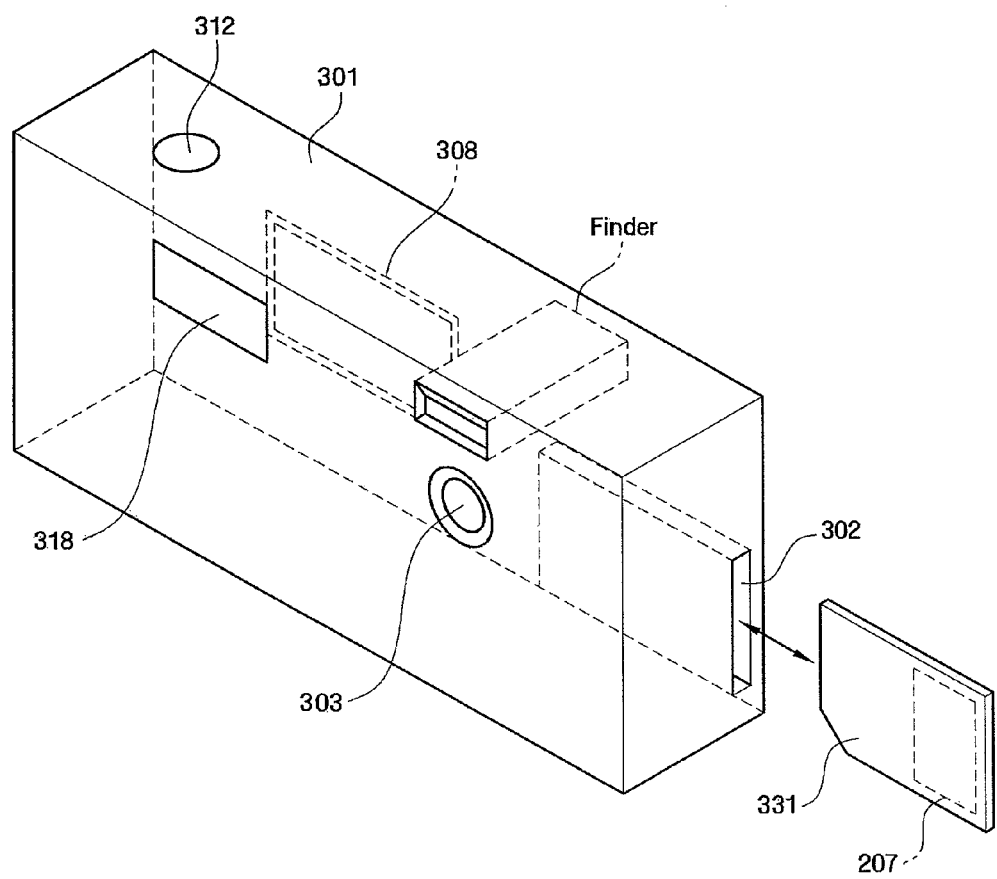
FIG. 32 illustrates a perspective view of an exemplary digital still camera employing nonvolatile memory devices according to embodiments.

FIG. 32 illustrates a perspective view of an exemplary digital still camera capable of employing nonvolatile memory devices according to embodiments. Referring to FIG. 32, the digital still camera includes a body 301, a slot 302, a lens 303, a display 308, a shutter button 312, a strobe 318, and the like. In particular, a memory card 331 is inserted into the slot 302. The memory card 331 may include at least one nonvolatile memory 207 according to an exemplary embodiment. In a case where the memory card 331 is of a contact type, the memory card 331 and a particular electric circuit on a circuit board electrically contact each other when the memory card 331 is inserted into the slot 308. In a case where the memory card 331 is of a non-contact type, the memory card 331 may communicate with a particular electric circuit on a circuit board through a wireless signal.

Figure 33A:
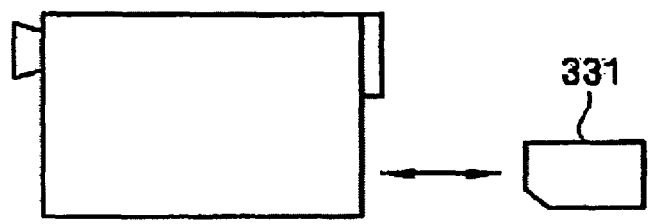
FIGS. 33A through 33J illustrate diagrams of various exemplary systems capable of employing the memory card shown in FIG. 31.
Figure 33B:
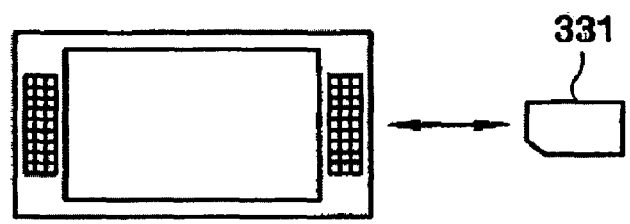
Figure 33C:
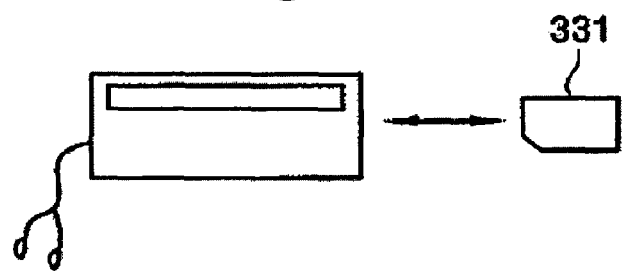
Figure 33D:
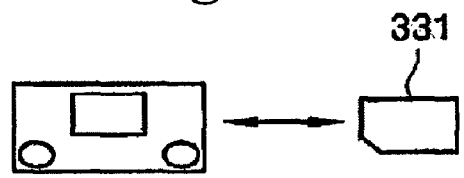
Figure 33E:
Figure 33F:
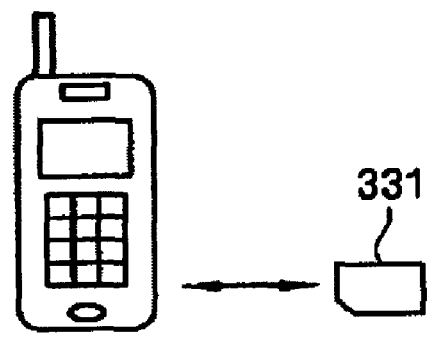
Figure 33G:
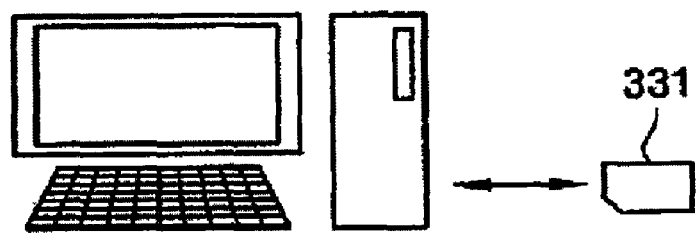
Figure 33H:
Figure 33I:
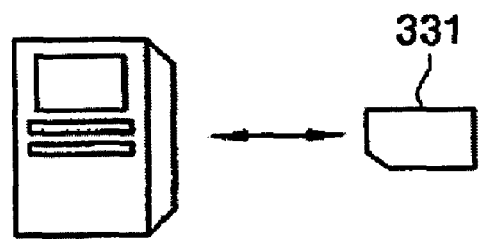
Figure 33J:
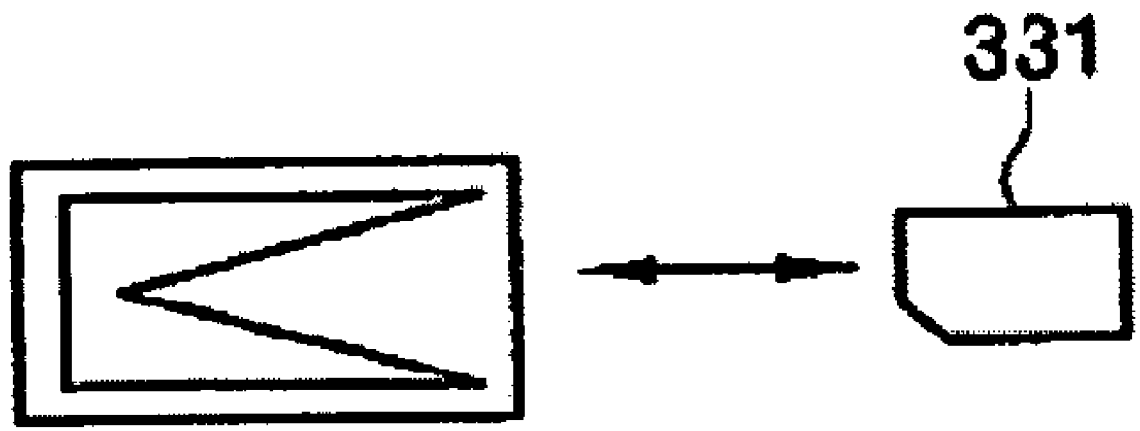

FIGS. 33A through 33J illustrate diagrams of various types of systems adapted to employ the memory card 331 of FIG. 31. Referring to FIGS. 33A through 33A, the memory card 331 may be respectively employed with, e.g., a video camera, a television (TV), audio equipment, a game device, an electronic musical apparatus, a cellular phone, a computer, a personal digital assistant (PDA), a voice recorder, a personal computer (PC) card, or the like.

Figure 34:
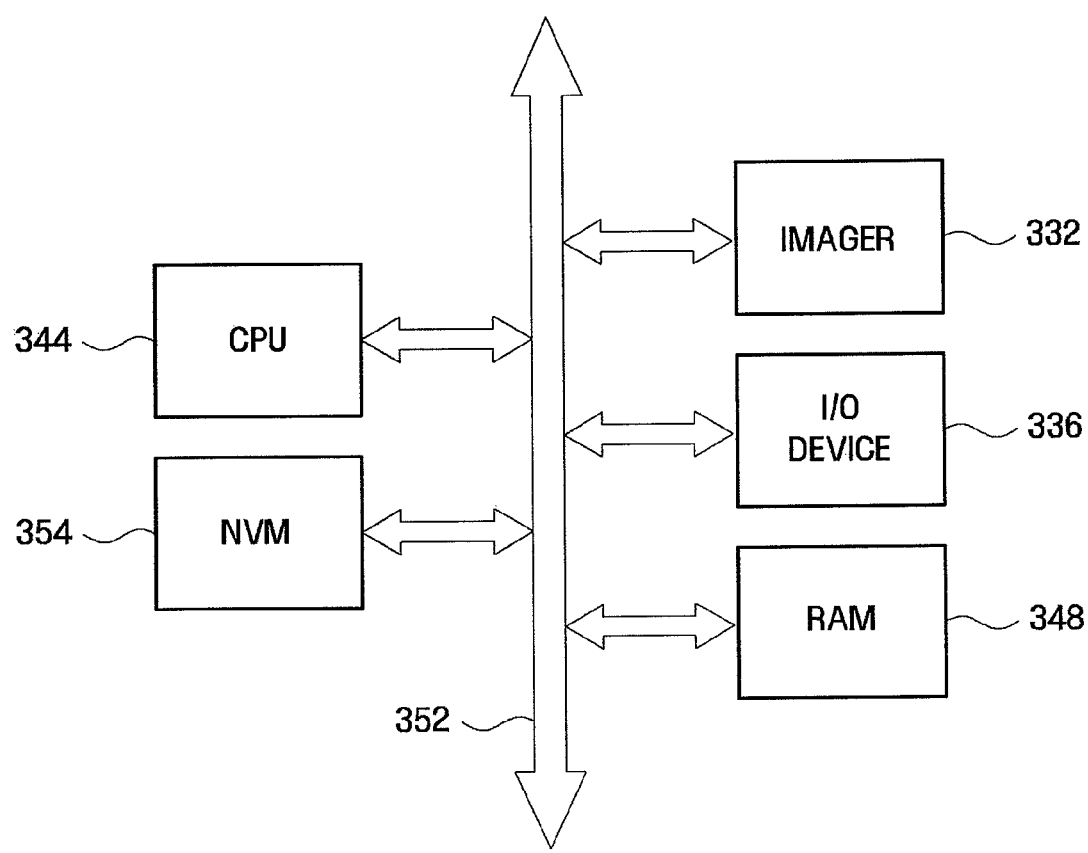
FIG. 34 illustrates a block diagram of an exemplary image sensor system capable of employing nonvolatile memory devices according to embodiments.

FIG. 34 illustrates a block diagram of an exemplary image sensor system employing nonvolatile memory devices according to embodiments. Referring to FIG. 34, the image sensor system may include an image sensor 332, an input output (I/O) device 336, a random access memory (RAM) 348, a central processing unit (CPU) 344, and a NVM 354 according to exemplary embodiments. Elements of the image sensor system, i.e., the image sensor 332, the I/O device 336, the RAM 348, the CPU 344, and the NVM 354 communicate with one another through a bus 352. Examples of the image sensor 332 may include photo sensing elements, such as a photogate or a photodiode. Each of the elements may be configured as one single chip with the processor. Alternatively, each of the elements may be configured as a chip separately from the processor.

Exemplary embodiments have been disclosed herein, and although specific terms are employed, they are used and are to be interpreted in a generic and descriptive sense only and not for purpose of limitation. Accordingly, it will be understood by those of ordinary skill in the art that various changes in form and details may be made without departing from the spirit and scope as set forth in the following claims.

What is claimed is:

1. A nonvolatile memory device, comprising:
   a memory cell array including a plurality of nonvolatile memory cells each having a resistance corresponding to one of a plurality of first resistance distributions;
   a temperature compensation circuit including one or more reference cells each having a resistance corresponding to one among one or more second resistance distributions; and
   a data read circuit including a compensation unit and a sense amplifier, the compensation unit being adapted to supply a compensation current to a sensing node, an amount of the compensation current varying based on the resistance of each reference cell, and the sense amplifier being adapted to compare the level of the sensing node with a reference level and to output a comparison result,
   wherein the nonvolatile memory cells are m-bit level cells, and each of the one or more reference cells has a resistance corresponding to one among $2^m-1$ second resistance distributions.

2. The nonvolatile memory device as claimed in claim 1, wherein the number of the one or more reference cells is $2^m-1$, each of the $2^m-1$ reference cells form a reference set, and $2^m-1$ reference cells belonging to a same one of the reference sets have resistances corresponding to different resistance distributions, respectively.

3. The nonvolatile memory device as claimed in claim 2, wherein the memory cell array is divided into a plurality of memory banks each divided into a plurality of memory blocks, and a corresponding one of the reference set is arranged at each of the memory banks and/or each of the memory blocks.

4. The nonvolatile memory device as claimed in claim 1, wherein the one of the second resistance distributions is positioned between two adjacent ones among the plurality of first resistance distributions.

5. The nonvolatile memory device as claimed in claim 1, wherein the compensation current compensates for a reduction in a level of the sensing node as a result of current flowing through a selected nonvolatile memory cell of the nonvolatile memory cell array.

6. The nonvolatile memory device as claimed in claim 5, further comprising a clamping unit coupled between a bit line coupled to the selected nonvolatile memory cell and the sensing node and adapted to control an amount of clamping current flowing from the sensing node into the bit line according to the resistances of the reference cells.

7. The nonvolatile memory device as claimed in claim 1, wherein the memory device is electrically coupled to a processor of a storage system, wherein the processor is adapted to control write and read operations of the nonvolatile memory device.

8. The nonvolatile memory device as claimed in claim 1, wherein the nonvolatile memory device is a phase change random access memory (PRAM) device.

9. The nonvolatile memory device as claimed in claim 8, wherein the data read circuit further include a clamping unit, the clamping unit being coupled to a bit line coupled to the selected nonvolatile memory cell and the sensing node and being adapted to control an amount of clamping current flowing from the sensing node into the bit line according to resistances of the reference cells.

10. The nonvolatile memory device as claimed in claim 1, wherein the temperature compensation circuit comprises:
a reference write driver adapted to supply write current to the reference cells to determine resistances of the reference cells; and
a reference read circuit adapted to supply read current to the reference cells to read resistances of the reference cells.

11. The nonvolatile memory device as claimed in claim 10, further comprising a write driver adapted to supply write current to the nonvolatile memory cells to determine resistances of the nonvolatile memory cells, wherein the reference write driver is a replica circuit of the write driver, and the reference read circuit is a replica circuit of the data read circuit.

12. A nonvolatile memory device, comprising:
a memory cell array including a plurality of nonvolatile memory cells each having a resistance corresponding to one of a plurality of first resistance distributions:,
a temperature compensation circuit including one or more reference cells each having a resistance corresponding to one among one or more second resistance distributions; and
a data read circuit including a compensation unit and a sense amplifier, the compensation unit being adapted to supply a compensation current to a sensing node, an amount of the compensation current varying based on the resistance of each reference cell, and the sense amplifier being adapted to compare the level of the sensing node with a reference level and to output a comparison result,
wherein the temperature compensation circuit includes:
a reference write driver adapted to supply write current to the reference cells to determine resistances of the reference cells; and
a reference read circuit adapted to supply read current to the reference cells to read resistances of the reference cells.

13. The nonvolatile memory device as claimed in claim 12, further comprising a write driver adapted to supply write current to the nonvolatile memory cells to determine resistances of the nonvolatile memory cells, wherein the reference write driver is a replica circuit of the write driver, and the reference read circuit is a replica circuit of the data read circuit.

14. The nonvolatile memory device as claimed in claim 12, wherein the temperature compensation circuit includes an output node connected to the reference cells, the reference write driver, and the reference read circuit, and the node output outputs a compensation control signal.

15. The nonvolatile memory device as claimed in claim 14, wherein the reference read circuit comprises:
first and second transistors connected to each other in series between a boosting voltage and the output node; and
a resistor array connected between the boosting voltage and a ground voltage, the resistor array generating first and second voltages, wherein the first voltage is to be applied to a gate of the first transistor, and the second voltage is to be applied to a gate of the second transistor.

16. The nonvolatile memory device as claimed in claim 12, wherein each of the reference cells includes a variable resistive element and an access element, the write driver passes through both the variable resistive element and the access element, and the read current passes through the variable resistive element and selectively passes through the access element.

17. The nonvolatile memory device as claimed in claim 12, wherein the nonvolatile memory cells are m-bit level cells, and each of the one or more reference cells has a resistance corresponding to one of $2^m-1$ second resistance distributions.

18. A method of driving a nonvolatile memory device, comprising:
supplying a memory cell array comprising m-bit (where m is a natural number) level cells and a reference set comprising $2^m-1$ reference cells;
writing data to the $2^m-1$ reference cells belonging to the reference set so that the 2m-1 reference cells have resistances respectively corresponding to different resistance distributions;
writing data to the m-bit level cells; and
supplying current varying according to the resistances of the $2^m-1$ reference cells to the m-bit level cells to read the data from the m-bit level cells.

19. The method as claimed in claim 18, wherein between writing the data to the $2^m-1$ reference cells and the writing of the data to the m-bit level cells, the method further includes reading the resistances of the $2^m-1$ reference cells.

* * * * *